United States Patent
Nojiri et al.

(10) Patent No.: US 11,821,787 B2
(45) Date of Patent: Nov. 21, 2023

(54) LIGHT DETECTION ELEMENT

(71) Applicant: TDK CORPORATION, Tokyo (JP)

(72) Inventors: Takeshi Nojiri, Tokyo (JP); Hideaki Fukuzawa, Tokyo (JP); Tetsuya Shibata, Tokyo (JP); Tomohito Mizuno, Tokyo (JP); Susumu Aoki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/079,388

(22) Filed: Dec. 12, 2022

(65) Prior Publication Data

US 2023/0341260 A1    Oct. 26, 2023

(30) Foreign Application Priority Data

Apr. 21, 2022   (JP) .................. 2022-069959

(51) Int. Cl.
| | | |
|---|---|---|
| *G01J 1/42* | (2006.01) | |
| *G02B 6/42* | (2006.01) | |
| *H10N 50/80* | (2023.01) | |

(52) U.S. Cl.
CPC .......... *G01J 1/4257* (2013.01); *G02B 6/4298* (2013.01); *H10N 50/80* (2023.02)

(58) Field of Classification Search
CPC ...... G02B 6/4274; G02B 6/4296; G02B 6/43; G02B 6/42; G02B 6/4292; G02B 6/4293; G02B 6/4298; G01J 2001/4295; G01J 1/4257; G11B 2005/3996; G11B 5/3909; G11B 5/3906; G11B 5/3903; G11B 5/39; G01R 33/00; G01R 33/02; G01R 33/098; G01R 33/096; G01R 33/095; G01R 33/093; G01R 33/091; G01R 33/09; G01R 33/066; G01R 33/06; H01F 10/342; H01F 10/3254; H10N 59/00; H10N 50/00; H10N 50/10; H10N 50/85; H10N 50/80

See application file for complete search history.

(56) References Cited

U.S. PATENT DOCUMENTS

| | | | |
|---|---|---|---|
| 6,925,261 B2 | 8/2005 | Haruyama | |
| 10,381,555 B2 * | 8/2019 | Shibata | ................. H10N 50/85 |
| 10,608,309 B2 * | 3/2020 | Yamane | ................. H01P 1/218 |
| 11,601,201 B2 * | 3/2023 | Lee | ..................... G02B 6/4292 |

(Continued)

FOREIGN PATENT DOCUMENTS

JP    2001-292107 A    10/2001

OTHER PUBLICATIONS

Chen et al., "All-Optical Switching of Magnetic Tunnel junctions with Single Subpicosecond Laser Pulses," Physical Review Applied, Feb. 2017, vol. 7, 021001-1-021001-6.

(Continued)

*Primary Examiner* — John R Lee
(74) *Attorney, Agent, or Firm* — Oliff PLC

(57) ABSTRACT

The light detection element includes a magnetic element and an optical waveguide. The magnetic element includes a first ferromagnetic layer, a second ferromagnetic layer, and a spacer layer sandwiched between the first ferromagnetic layer and the second ferromagnetic layer. The optical waveguide includes at least a core and a cladding covering at least a part of the core. Light that has propagated through the optical waveguide is applied to the magnetic element.

17 Claims, 22 Drawing Sheets

(56) References Cited

U.S. PATENT DOCUMENTS

| | | | |
|---|---|---|---|
| 2003/0169981 A1* | 9/2003 | Nakanishi | H01S 5/0232 |
| | | | 385/92 |
| 2004/0047021 A1* | 3/2004 | Sakane | G02B 6/4208 |
| | | | 359/237 |
| 2015/0333839 A1 | 11/2015 | Li et al. | |
| 2021/0293909 A1* | 9/2021 | Degawa | G01R 33/098 |
| 2022/0010423 A1 | 1/2022 | Suzuki et al. | |
| 2022/0068537 A1 | 3/2022 | Mizuno et al. | |
| 2022/0131020 A1* | 4/2022 | Mizuno | H01L 31/022466 |
| 2022/0231181 A1* | 7/2022 | Yamane | H10N 50/10 |
| 2022/0252449 A1* | 8/2022 | Degawa | G01J 1/0488 |
| 2022/0317397 A1* | 10/2022 | Shibata | G02B 6/12004 |
| 2022/0317484 A1* | 10/2022 | Shibata | H01S 5/4093 |
| 2022/0416096 A1* | 12/2022 | Yamane | G01R 33/093 |

OTHER PUBLICATIONS

Al Azim et al., "Optical Receiver With Helicity-Dependent Magnetization Reversal," IEEE Transactions on Magnetics, Jan. 2019, vol. 55, No. 1, 4400206.

\* cited by examiner

LIGHT DETECTION ELEMENT

BACKGROUND

The disclosure relates to a light detection element. Priority is claimed on Japanese Patent Application No. 2022-069959, filed Apr. 21, 2022, the content of which is incorporated herein by reference.

Photoelectric conversion elements are used for various purposes.

With the spread of the Internet, amounts of communication have increased dramatically and the importance of optical communication is increasing. Optical communication is a communication means for converting an electrical signal into an optical signal and performing transmission and reception using the optical signal.

For example, Patent Document 1 describes a receiving device that receives an optical signal using a photodiode. The photodiode is, for example, a pn junction diode using a semiconductor pn junction or the like.

PATENT DOCUMENTS

[Patent Document 1] Japanese Unexamined Patent Application, First Publication No. 2001-292107

SUMMARY

Although light detection elements using semiconductor pn junctions are widely used as photoelectric conversion elements, a new breakthrough is required for further development.

It is desirable to provide a novel light detection element. The following means are provided.

A light detection element including: a magnetic element; and an optical waveguide, wherein the magnetic element includes a first ferromagnetic layer, a second ferromagnetic layer, and a spacer layer sandwiched between the first ferromagnetic layer and the second ferromagnetic layer, wherein the optical waveguide includes at least a core and a cladding covering at least a part of the core, wherein light that has propagated through the optical waveguide is applied to the magnetic element.

DETAILED DESCRIPTION

Figure 1:
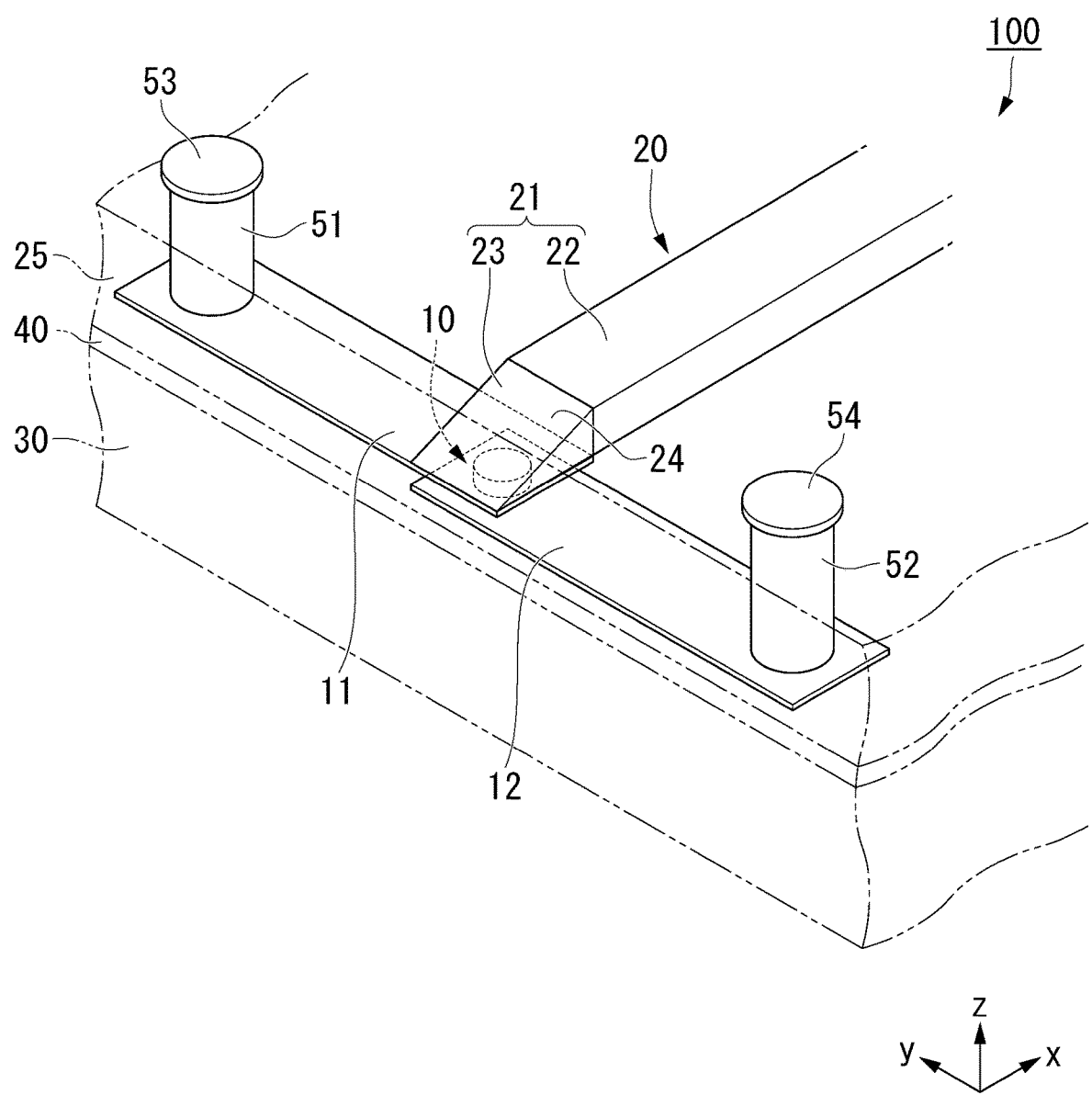
FIG. 1 is a perspective diagram of a light detection element according to a first embodiment.

Hereinafter, present embodiments will be described in detail with reference to the drawings as appropriate. In the drawings used in the following description, featured parts may be enlarged for convenience such that the features of the disclosure are easier to understand, and dimensional ratios and the like of the respective components may be different from actual ones. Materials, dimensions, and the like exemplified in the following description are examples, the disclosure is not limited thereto, and modifications can be appropriately made in a range in which advantageous effects of the disclosure are exhibited.

Directions will be defined. A direction in the plane in which a substrate 30 extends is defined as an x-direction and a direction in a plane orthogonal to the x-direction is defined as a y-direction. For example, a direction in which a main part of a core of an optical waveguide to be described below extends is defined as the x-direction. A direction perpendicular to the plane of the substrate 30 (a direction orthogonal to the x-direction and the y-direction) is defined as a z-direction. Hereinafter, a +z-direction may be expressed as an "upward" direction and a −z-direction may be expressed as a "downward" direction. The upward and downward directions do not always coincide with a direction in which gravity is applied.

First Embodiment

Figure 2:
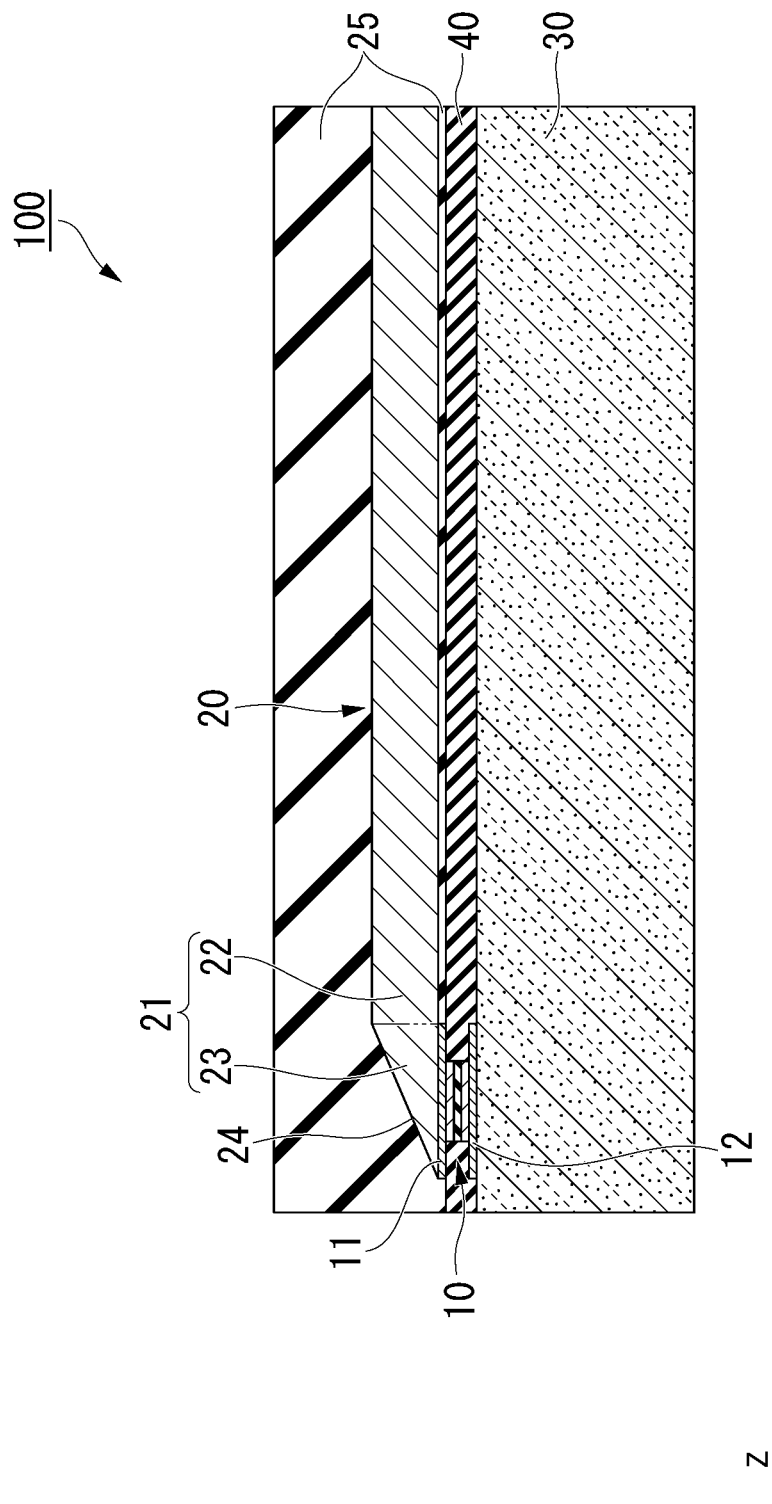
FIG. 2 is a cross-sectional view of the light detection element according to the first embodiment.
Figure 3:
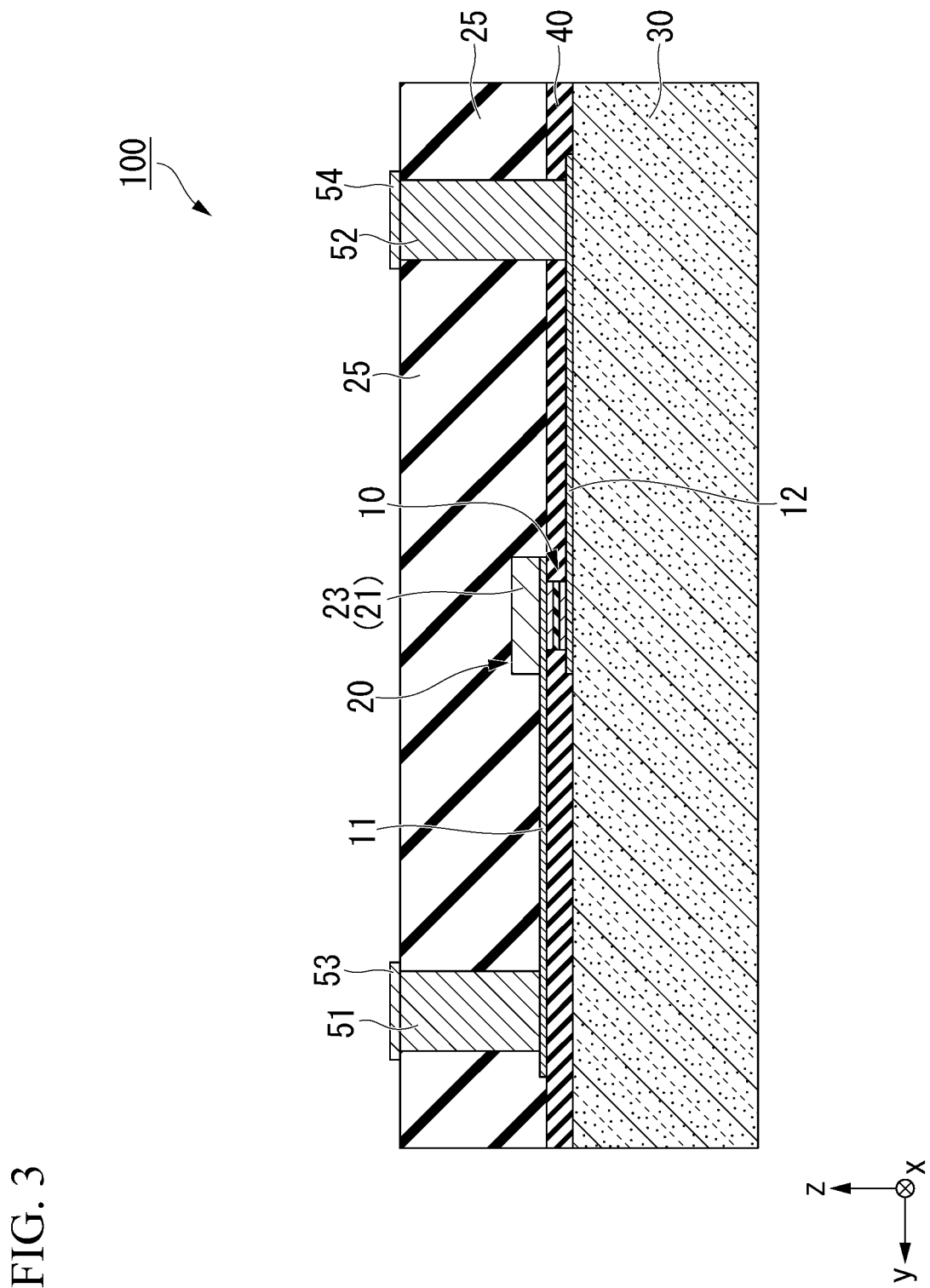
FIG. 3 is a cross-sectional view of the light detection element according to the first embodiment.
Figure 4:
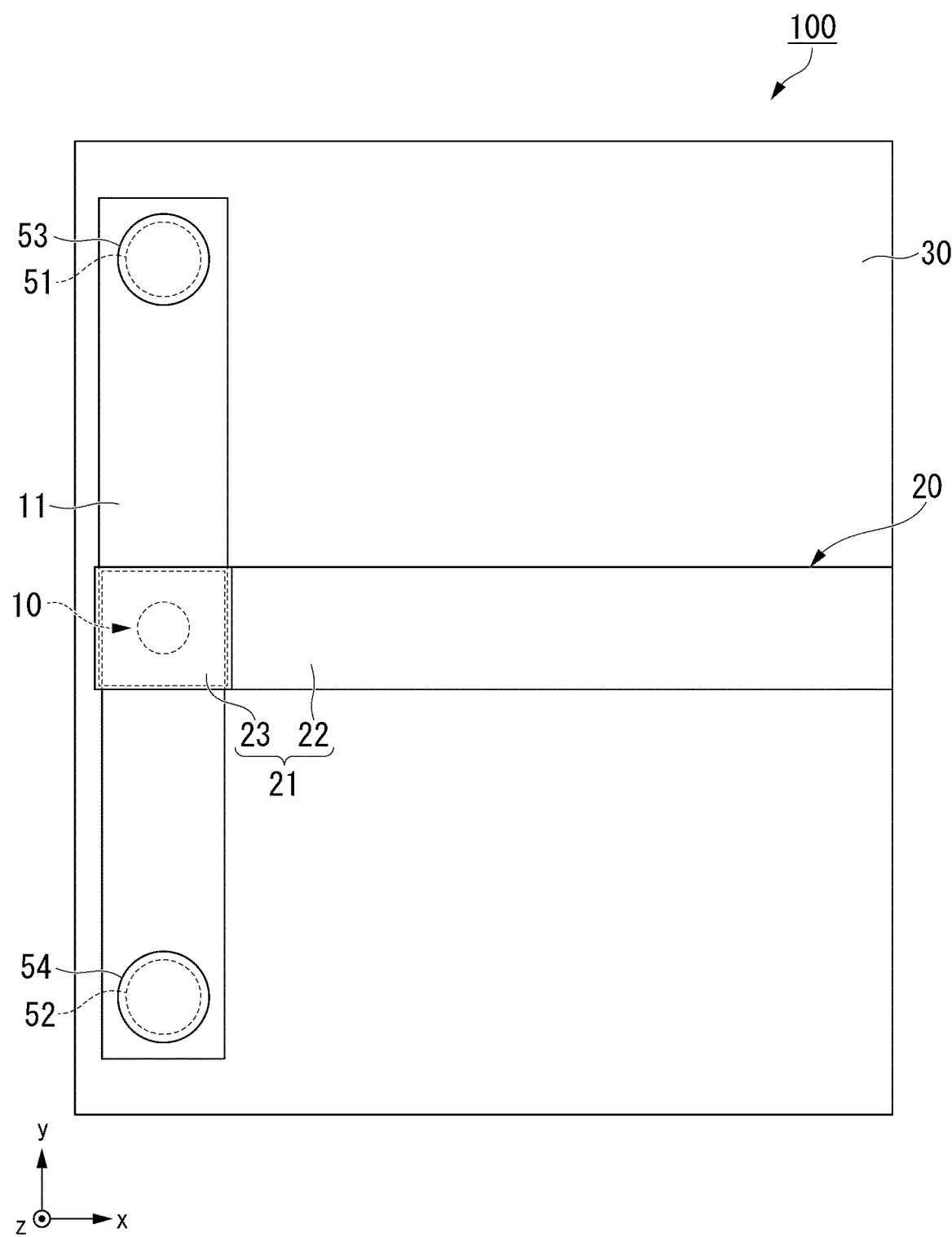
FIG. 4 is a plan view of the light detection element according to the first embodiment.

FIG. 1 is a perspective view of a light detection element 100 according to a first embodiment. FIGS. 2 and 3 are cross-sectional views of the light detection element 100 according to the first embodiment. FIG. 2 is an xz cross-section passing through the center of a core 21 in a width direction. FIG. 3 is a yz cross-section passing through the center of a magnetic element 10. FIG. 4 is a plan view of the light detection element 100 according to the first embodiment. FIG. 4 is an illustration in a state in which a cladding 25 and an insulating layer 40 are removed.

The light detection element 100 includes, for example, the magnetic element 10, a first electrode 11, a second electrode 12, an optical waveguide 20, the substrate 30, and an insulating layer 40. Light that has propagated through the optical waveguide 20 is applied to the magnetic element 10.

Light emitted from a light source propagates through the optical waveguide 20. The light source is, for example, a laser diode, an LED, or the like. There may be an optical member between the light source and an input end of the optical waveguide 20. The optical member is, for example, a lens, a meta-lens, a wavelength filter, an optical fiber, a reflector, or the like. For example, light that has been emitted from a light source and that has propagated through the optical waveguide 20 via the optical member is applied to the magnetic element 10. A part of the light emitted from the light source may directly propagate through the optical waveguide 20 and may be applied to the magnetic element 10.

The light propagating through the optical waveguide 20 is, for example, monochromatic light with a single wavelength such as laser light. The light propagating through the optical waveguide 20 may not be monochromatic light or may be light whose wavelength is limited to a range with a certain width or light having a continuous spectrum. The light propagating through the optical waveguide 20 is not limited to a visible light ray and also includes an infrared ray having a longer wavelength than the visible light ray or an ultraviolet ray having a shorter wavelength than the visible light ray. The wavelength of the visible light ray is, for example, 380 nm or more and less than 800 nm. The wavelength of the infrared ray is, for example, 800 nm or more and 1 mm or less. The wavelength of the ultraviolet ray is, for example, 200 nm or more and less than 380 nm. The light propagating through the optical waveguide 20 is, for example, light containing a high-frequency optical signal and varying in intensity or light whose wavelength band is controlled (for example, light passing through a wavelength filter). A high-frequency optical signal is, for example, a signal having a frequency of 100 MHz or higher.

The optical waveguide 20 includes at least a core 21 and a cladding 25. At least a part of the core 21 is covered with the cladding 25.

The core 21 contains, for example, lithium niobate as a main component. Some elements of lithium niobate may be replaced with other elements. The cladding 25 is, for example, $SiO_2$, $Al_2O_3$, $MgF_2$, $La_2O_3$, ZnO, $HfO_2$, MgO, $Y_2O_3$, $CaF_2$, $In_2O_3$, or a mixture thereof. Materials for the core 21 and the cladding 25 are not limited to these examples. For example, the core 21 may be silicon or silicon oxide to which germanium oxide is added, and the cladding 25 may be silicon oxide. Tantalum oxide, silicon nitride ($Si_3N_4$), or the like can also be used for the core 21. The optical waveguide 20 may be a plasmonic waveguide. When the optical waveguide 20 is a plasmonic waveguide, the core 21 is, for example, silicon or silicon oxide, and the cladding 25 is, for example, a metal such as Au, Ag, or Al.

The core 21 includes, for example, a main part 22 and a first part 23. The main part 22 extends, for example, in the x-direction. The x-direction is an example of a first direction intersecting the lamination direction of the magnetic element 10. The lamination direction of the magnetic element 10 coincides with, for example, the z-direction. The width of the core 21 in the y-direction is, for example, 0.4 µm or more and 8 µm or less. The z-direction thickness of the main part 22 of the core 21 is, for example, 0.2 µm or more and 8 µm or less. When the optical waveguide 20 is a plasmonic waveguide, the width of the core 21 in the y-direction is, for example, 20 nm or more and 100 nm or less, and the thickness of the main part 22 of the core 21 in the z-direction is, for example, 20 nm or more and 100 nm or less.

The first part 23 is connected to the main part 22. The first part 23 is connected to an end of the main part 22 opposite to a light incidence end. Light propagates from the main part 22 toward the first part 23.

The optical waveguide 20 includes a tilted reflective surface 24. The tilted reflective surface 24 is a part of an interface between the first part 23, which is a part of the core 21, and the cladding 25. The tilted reflective surface 24 intersects the lamination direction of the magnetic element 10 and the first direction described above. The tilted reflective surface 24 intersects, for example, the x-direction and the z-direction. For example, a thickness of the first part 23 in the z-direction is thinner when a distance from a connection surface between the first part 23 and the main part 22 is longer. Light propagating through the main part 22 and reflected by the tilted reflective surface 24 is applied to the magnetic element 10. A position of the tilted reflective surface 24 in the z-direction (the lamination direction of the magnetic element 10) is different from a position of the magnetic element 10 in the z-direction. The tilted reflective surface 24 is located, for example, at a position overlapping the magnetic element 10 when viewed from the lamination direction of the magnetic element 10. For example, the tilted reflective surface 24 is located above the magnetic element 10 in the z-direction.

Figure 5:
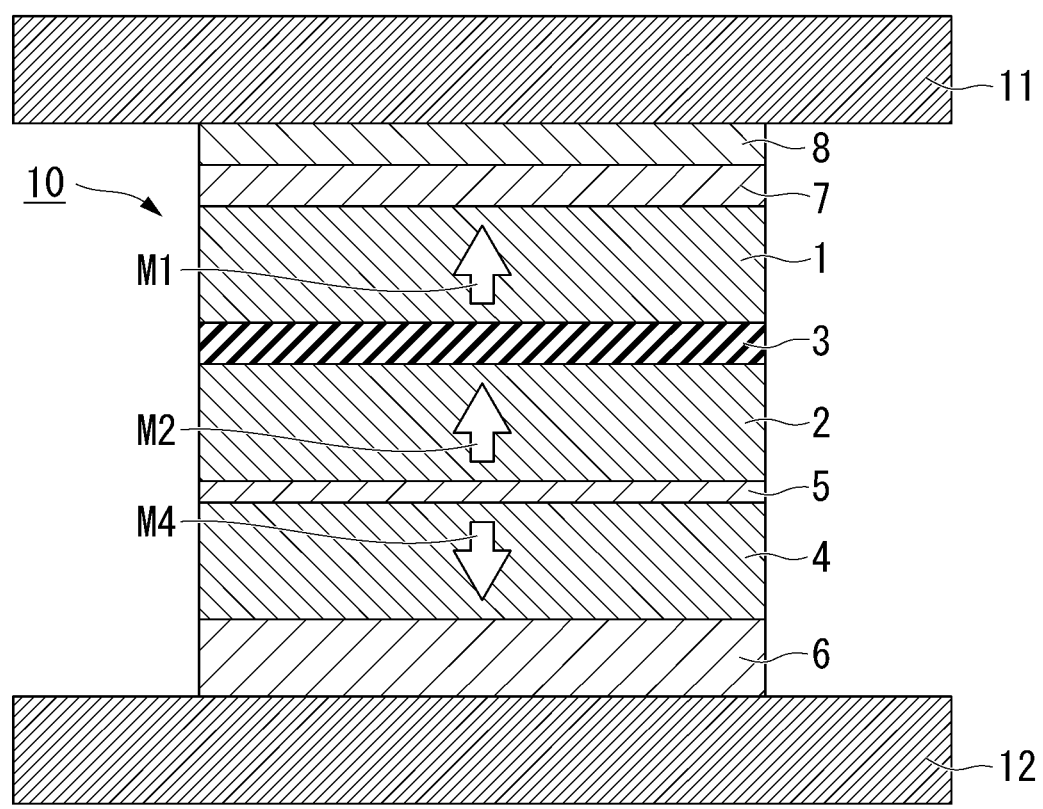
FIG. 5 is a cross-sectional view of a magnetic element according to the first embodiment.

The magnetic element 10 is located at a position where light that has propagated through the optical waveguide 20 is applied (a position where light reflected by the tilted reflective surface 24 is applied). FIG. 5 is a cross-sectional view of the magnetic element 10 according to the first embodiment. In FIG. 5, the first electrode 11 and the second electrode 12 are shown at the same time and the directions of magnetization of the ferromagnetic material in the initial state to be described below are indicated by arrows.

The magnetic element 10 has at least a first ferromagnetic layer 1, a second ferromagnetic layer 2, and a spacer layer 3. The spacer layer 3 is located between the first ferromagnetic layer 1 and the second ferromagnetic layer 2. The magnetic element 10 may have a third ferromagnetic layer 4, a magnetic coupling layer 5, an underlayer 6, a perpendicular magnetization inducing layer 7, and a cap layer 8 in addition to these. The third ferromagnetic layer 4, the magnetic coupling layer 5, and the underlayer 6 are located between the second ferromagnetic layer 2 and the second electrode 12, and the perpendicular magnetization inducing layer 7 and the cap layer 8 are located between the first ferromagnetic layer 1 and the first electrode 11. A maximum width of the magnetic element 10 is, for example, 10 nm or more and 2000 nm or less, may be 30 nm or more and 500 nm or less, when viewed from above in the lamination direction. A thickness of the magnetic element 10 in the lamination direction is, for example, 15 nm or more and 40 nm or less.

The magnetic element 10 is, for example, a magnetic tunnel junction (MTJ) element in which the spacer layer 3 is made of an insulating material. A resistance value of the magnetic element 10 changes when light is applied from the outside. The resistance value of the magnetic element 10 in the z-direction (the resistance value when an electric current flows in the z-direction) changes in accordance with a relative change between a state of magnetization M1 of the first ferromagnetic layer 1 and a state of magnetization M2 of the second ferromagnetic layer 2. Such an element is also referred to as a magnetoresistance effect element.

The first ferromagnetic layer 1 is a light detection layer whose magnetization state changes when light is applied from the outside. The first ferromagnetic layer 1 is also referred to as a magnetization free layer. The magnetization free layer is a layer containing a magnetic material whose magnetization state changes when prescribed external energy has been applied. The prescribed external energy is, for example, light applied from the outside, a current flowing in the lamination direction of the magnetic element 10, or an external magnetic field. The state of the magnetization M1 of the first ferromagnetic layer 1 changes in accordance with the intensity of the applied light.

The first ferromagnetic layer 1 includes a ferromagnetic material. The first ferromagnetic layer 1 includes, for example, at least one of magnetic elements such as Co, Fe, and Ni. The first ferromagnetic layer 1 may include B, Mg, Hf, and Gd together with the above-described magnetic elements. The first ferromagnetic layer 1 may be, for example, an alloy including a magnetic element and a nonmagnetic element. The first ferromagnetic layer 1 may include a plurality of layers. The first ferromagnetic layer 1 is, for example, a CoFeB alloy, a laminate in which a CoFeB alloy layer is sandwiched between Fe layers, and a laminate in which a CoFeB alloy layer is sandwiched between CoFe layers.

Also, the first ferromagnetic layer 1 may be a laminate in which a magnetic layer and a nonmagnetic layer are alternately laminated. For example, the first ferromagnetic layer 1 may be a laminate in which Co and Pt are alternately laminated or a laminate in which Co and Ni are alternately laminated. Generally, "ferromagnetism" includes "ferrimagnetism." The first ferromagnetic layer 1 may exhibit ferrimagnetism. On the other hand, the first ferromagnetic layer 1 may exhibit ferromagnetism that is not ferrimagnetism. For example, CoFeB alloys exhibit ferromagnetism that is not ferrimagnetism.

The first ferromagnetic layer 1 may be an in-plane magnetization film having an axis of easy magnetization in an in-plane direction or a perpendicular magnetization film having an axis of easy magnetization in the direction perpendicular to a film surface (the lamination direction of the magnetic element 10).

A thickness of the first ferromagnetic layer 1 is, for example, 1 nm or more and 5 nm or less. The thickness of the first ferromagnetic layer 1 may be, for example, 1 nm or more and 2 nm or less. If the thickness of the first ferromagnetic layer 1 is thin when the first ferromagnetic layer 1 is a perpendicular magnetization film, the effect of applying perpendicular magnetic anisotropy from the layers above and below the first ferromagnetic layer 1 is strengthened and perpendicular magnetic anisotropy of the first ferromagnetic layer 1 increases. That is, when the perpendicular magnetic anisotropy of the first ferromagnetic layer 1 increases, a force for the magnetization M1 to return in the direction perpendicular to the film surface (the original state) is strengthened. On the other hand, when the thickness of the first ferromagnetic layer 1 is thick, the effect of applying the perpendicular magnetic anisotropy from the layers above and below the first ferromagnetic layer 1 is relatively weakened and the perpendicular magnetic anisotropy of the first ferromagnetic layer 1 is weakened.

The volume of a ferromagnetic material becomes small when the thickness of the first ferromagnetic layer 1 becomes thin. The volume of a ferromagnet becomes large when the thickness of the first ferromagnetic layer 1 becomes thick. The susceptibility of the magnetization of the first ferromagnetic layer 1 when external energy has been applied is inversely proportional to a product (KuV) of the magnetic anisotropy (Ku) and the volume (V) of the first ferromagnetic layer 1. That is, when the product of the magnetic anisotropy and the volume of the first ferromagnetic layer 1 becomes small, the reactivity to light increases. From this point of view, to increase the reaction to light, the magnetic anisotropy of the first ferromagnetic layer 1 may be appropriately designed and then the volume of the first ferromagnetic layer 1 may be reduced.

When the thickness of the first ferromagnetic layer 1 is thicker than 2 nm, an insertion layer made of, for example, Mo and W may be provided within the first ferromagnetic layer 1. That is, the first ferromagnetic layer 1 may be a laminate in which the ferromagnetic layer, the insertion layer, and the ferromagnetic layer are laminated in that order in the z-direction. Interfacial magnetic anisotropy at an interface between the insertion layer and the ferromagnetic layer enhances the perpendicular magnetic anisotropy of the entire first ferromagnetic layer 1. A thickness of the insertion layer is, for example, 0.1 nm to 0.6 nm.

The second ferromagnetic layer 2 is a magnetization fixed layer. The magnetization fixed layer is a layer made of a magnet whose magnetization state is less likely to change than that of the magnetization free layer when prescribed external energy has been applied. For example, in the magnetization fixed layer, a direction of magnetization is less likely to change than that in the magnetization free layer when prescribed external energy has been applied. Also, for example, in the magnetization fixed layer, a magnitude of magnetization is less likely to change than that in the magnetization free layer when prescribed external energy is applied. For example, coercivity of the second ferromagnetic layer 2 is greater than that of the first ferromagnetic layer 1. The second ferromagnetic layer 2 may be either an in-plane magnetization film or a perpendicular magnetization film. In the example shown in FIG. 5, the direction of the magnetization M2 of the second ferromagnetic layer 2 is the z-direction. The thickness of the second ferromagnetic layer 2 is, for example, 1 nm or more and 5 nm or less.

For example, the material constituting the second ferromagnetic layer 2 is similar to that of the first ferromagnetic layer 1. The second ferromagnetic layer 2 may be, for example, a multilayer film in which Co having a thickness of 0.4 nm to 1.0 nm and Pt having a thickness of 0.4 nm to 1.0 nm are alternately laminated several times. The second ferromagnetic layer 2 may be, for example, a laminate in which Co having a thickness of 0.4 nm to 1.0 nm, Mo having a thickness of 0.1 nm to 0.5 nm, a CoFeB alloy having a thickness of 0.3 nm to 1.0 nm, and Fe having a thickness of 0.3 nm to 1.0 nm are laminated in that order.

The magnetization M2 of the second ferromagnetic layer 2 may be fixed, for example, through magnetic coupling with the third ferromagnetic layer 4 sandwiching the magnetic coupling layer 5. In this case, a combination of the second ferromagnetic layer 2, the magnetic coupling layer 5, and the third ferromagnetic layer 4 may be referred to as a magnetization fixed layer. Details of the third ferromagnetic layer 4 and the magnetic coupling layer 5 will be described below.

The spacer layer 3 is a layer arranged between the first ferromagnetic layer 1 and the second ferromagnetic layer 2. The spacer layer 3 includes a layer made of a conductor, an insulator, or a semiconductor or a layer including a current carrying point formed of a conductor within an insulator. The spacer layer 3 is, for example, a nonmagnetic layer. A thickness of the spacer layer 3 can be adjusted in accordance with orientation directions of the magnetization M1 of the first ferromagnetic layer 1 and the magnetization M2 of the second ferromagnetic layer 2 in an initial state to be described below.

For example, when the spacer layer 3 is made of an insulator, the magnetic element 10 has a magnetic tunnel junction (MTJ) containing the first ferromagnetic layer 1, the spacer layer 3, and the second ferromagnetic layer 2. Such an element is referred to as an MTJ element. In this case, the magnetic element 10 can exhibit a tunnel magnetoresistance (TMR) effect. For example, when the spacer layer 3 is made of a metal, the magnetic element 10 can exhibit a giant magnetoresistance (GMR) effect. Such an element is referred to as a GMR element. The magnetic element 10 may be referred to as an MTJ element, a GMR element, or the like according to the constituent material of the spacer layer 3, but is also generically referred to as a magnetoresistance effect element.

When the spacer layer 3 is made of an insulating material, materials including aluminum oxide, magnesium oxide, titanium oxide, silicon oxide, and the like can be used as a material of the spacer layer 3. Also, these insulating materials may include elements such as Al, B, Si, and Mg and magnetic elements such as Co, Fe, and Ni. A high magnetoresistance change rate can be obtained by adjusting the thickness of the spacer layer 3 so that a strong TMR effect is exhibited between the first ferromagnetic layer 1 and the second ferromagnetic layer 2. In order to use the TMR effect efficiently, the thickness of the spacer layer 3 may be about 0.5 to 5.0 nm or about 1.0 to 2.5 nm.

When the spacer layer 3 is made of a nonmagnetic conductive material, a conductive material such as Cu, Ag, Au, or Ru can be used. In order to use the GMR effect efficiently, the thickness of the spacer layer 3 may be about 0.5 to 5.0 nm or about 2.0 to 3.0 mm.

When the spacer layer 3 is made of a nonmagnetic semiconductor material, a material such as zinc oxide, indium oxide, tin oxide, germanium oxide, gallium oxide, or indium tin oxide (ITO) can be used. In this case, the thickness of the spacer layer 3 may be about 1.0 to 4.0 nm.

When a layer including a current carrying point made of a conductor within a nonmagnetic insulator is applied as the spacer layer 3, a structure may be formed to include a current carrying point made of a nonmagnetic conductor of Cu, Au, Al, or the like within the nonmagnetic insulator made of aluminum oxide or magnesium oxide. Also, the conductor may be made of a magnetic element such as Co, Fe, or Ni. In this case, the thickness of the spacer layer 3 may be about 1.0 to 2.5 nm. The current carrying point is, for example, a columnar body having a diameter of 1 nm or more and 5 nm or less when viewed from a direction perpendicular to a film surface.

The third ferromagnetic layer 4 is magnetically coupled to, for example, the second ferromagnetic layer 2. The magnetic coupling is, for example, antiferromagnetic coupling and is caused by Ruderman-Kittel-Kasuya-Yosida (RKKY) interaction. There is an antiparallel relationship between the direction of the magnetization M2 of the second ferromagnetic layer 2 and the direction of the magnetization M4 of the third ferromagnetic layer 4. The material constituting the third ferromagnetic layer 4 is, for example, similar to that of the first ferromagnetic layer 1.

The magnetic coupling layer 5 is located between the second ferromagnetic layer 2 and the third ferromagnetic layer 4. The magnetic coupling layer 5 is, for example, Ru, Ir, or the like.

The underlayer 6 is between the third ferromagnetic layer 4 and the second electrode 12. The underlayer 6 is a seed layer or a buffer layer. The seed layer enhances the crystallinity of layers in contact with the seed layer. The seed layer is, for example, Pt, Ru, Hf, Zr, or NiFeCr. A thickness of the seed layer is, for example, 1 nm or more and 5 nm or less. The buffer layer is a layer for mitigating the lattice mismatch between different crystals. The buffer layer is, for example, Ta, Ti, W, Zr, Hf, or a nitride of these elements. A thickness of the buffer layer is, for example, 1 nm or more and 5 nm or less.

The cap layer 8 is between the first ferromagnetic layer 1 and the first electrode 11. The cap layer 8 enhances the crystallinity of layers in contact with the cap layer 8 during annealing. A thickness of the cap layer 8 is, for example, 10 nm or less such that sufficient light is applied to the first ferromagnetic layer 1. The cap layer 8 is, for example, MgO, W, Mo, Ru, Ta, Cu, Cr, or a laminated film thereof.

The perpendicular magnetization inducing layer 7 induces perpendicular magnetic anisotropy of the first ferromagnetic layer 1. The perpendicular magnetization inducing layer 7 is, for example, magnesium oxide, W, Ta, Mo, or the like. When the perpendicular magnetization inducing layer 7 is magnesium oxide, the magnesium oxide may be oxygen-deficient to increase conductivity. A thickness of the perpendicular magnetization inducing layer 7 is, for example, 0.5 nm or more and 5.0 nm or less.

The first electrode 11 is arranged, for example, on the side where light is applied to the magnetic element 10. In this case, at least a part of the first electrode 11 is sandwiched between the magnetic element 10 and the first part 23. For example, the first electrode 11 is electrically connected to the magnetic element 10. Also, the first electrode 11 is in contact with, for example, the first part 23 of the core 21.

The light that has propagated through the optical waveguide 20 is applied from the first electrode 11 side to the magnetic element 10 and is applied to at least the first ferromagnetic layer 1. The first electrode 11 is made of a conductive material. The first electrode 11 is, for example, a transparent electrode transparent to light in a used wavelength range. The first electrode 11 may transmit, for example, 80% or more of the light in the used wavelength range.

The first electrode 11 is, for example, an oxide such as indium tin oxide (ITO), indium zinc oxide (IZO), zinc oxide (ZnO), or indium gallium zinc oxide (IGZO). The first electrode 11 may be configured to have a plurality of columnar metals among transparent electrode materials of these oxides. It is not essential to use the transparent electrode material as described above for the first electrode 11. Light to be applied may be allowed to reach the first ferromagnetic layer 1 using a metallic material such as Au, Cu, or Al in a thin film thickness. When a metal is used as the material of the first electrode 11, the film thickness of the first electrode 11 is, for example, 3 to 10 nm. Also, the first electrode 11 may have an antireflection film on an irradiation surface to which light is applied.

When the first electrode 11 is in contact with the core 21, an absolute value of a refractive index difference between the first electrode 11 and the core 21 may be smaller than an absolute value of a refractive index difference between the core 21 and the cladding 25. For example, when the cladding 25 is made of aluminum oxide, the first electrode 11 is made of ITO (a mixture ratio of indium oxide and tin oxide is 2:1), and the core 21 is made of lithium niobate, a condition of the refractive index difference described above is satisfied. When the condition of the refractive index difference described above is satisfied, reflection of light that has propagated through the core 21 at an interface between the core 21 and the first electrode 11 can be suppressed and most of the light that has propagated through the core 21 can be applied to the magnetic element 10. Here, an example in which the refractive index of the first electrode 11 is smaller than the refractive index of the core 21 is given, but the refractive index of the first electrode 11 may be larger than the refractive index of the core 21 or may be the same as the refractive index of the core 21.

The second electrode 12 sandwiches the magnetic element 10 with the first electrode 11 and is located on the side opposite to the first electrode 11. For example, the second electrode 12 is electrically connected to the magnetic element 10. The second electrode 12 is made of a conductive material. The second electrode 12 is made of, for example, a metal such as Cu, Al, or Au. Ta or Ti may be laminated above and below these metals. Also, a laminated film of Cu and Ta, a laminated film of Ta, Cu and Ti, or a laminated film of Ta, Cu, and TaN may be used. Also, TiN or TaN may be used as the second electrode 12. A thickness of the second electrode 12 is, for example, 200 nm to 800 nm.

The second electrode 12 may be transparent to light applied to the magnetic element 10. As a material for the second electrode 12, like the first electrode 11, for example, a transparent electrode material of an oxide such as indium tin oxide (ITO), indium zinc oxide (IZO), zinc oxide (ZnO), and indium gallium zinc oxide (IGZO) may also be used. Even if the light is applied from the first electrode 11, the light may reach the second electrode 12 according to the intensity of the light. In this case, the second electrode 12 is configured to contain a transparent electrode material of an oxide, such that it is possible to suppress reflection of light at an interface between the second electrode 12 and the layer in contact therewith, compared to the case where the second electrode 12 is made of a metal.

The first electrode 11 is connected to a via wiring 51. The second electrode 12 is connected to a via wiring 52. The via wiring 51 connects the first electrode 11 and the external electrode 53. The via wiring 52 connects the second electrode 12 and the external electrode 54. Each of the via wirings 51 and 52 penetrates at least one of the cladding 25 and the insulating layer 40 in the z-direction. For example, each of the external electrodes 53 and 54 is exposed on the upper surface of the cladding 25. The via wirings 51 and 52 and the external electrodes 53 and 54 contain a conductive material.

A maximum width of each of the via wirings 51 and 52 is, for example, 10 nm or more and 2000 nm or less, may be 30 nm or more and 500 nm or less, when viewed from above in the lamination direction. A longest width of the via wiring 51 when viewed from above in the lamination direction is, for example, shorter than the width of the first electrode 11 in the x-direction. A longest width of the via wiring 52 when viewed from above in the lamination direction is, for example, shorter than the width of the second electrode 12 in the x-direction.

The insulating layer 40 covers the periphery of the magnetic element 10. The insulating layer 40 is an interlayer insulating layer. The insulating layer 40 is, for example, an oxide, a nitride, or an oxynitride of Si, Al, or Mg. The insulating layer 40 is made of, for example, silicon oxide ($SiO_x$), silicon nitride ($SiN_x$), silicon carbide (SiC), chromium nitride (CrN), silicon carbonitride (SiCN), silicon oxynitride (SiON), aluminum oxide ($Al_2O_3$), zirconium oxide ($ZrO_x$), or the like. The insulating layer 40 may be made of a material that is the same as that of the cladding 25 and the insulating layer 40 and the cladding 25 may be integrated.

The magnetic element 10 and the optical waveguide 20 are located, for example, on the substrate 30. The position of the magnetic element 10 in the z-direction is located between the position of the tilted reflective surface 24 in the z-direction and the position of the substrate 30 in the z-direction. For example, the magnetic element 10 is sandwiched between the substrate 30 and the tilted reflective surface 24 in the z-direction.

The substrate 30 contains, for example, aluminum oxide. The substrate 30 is, for example, sapphire. The substrate 30 may be a semiconductor substrate such as silicon.

Next, a method of manufacturing the light detection element 100 will be described. First, the second electrode 12, the underlayer 6, the third ferromagnetic layer 4, the magnetic coupling layer 5, the second ferromagnetic layer 2, the spacer layer 3, the first ferromagnetic layer 1, the perpendicular magnetization inducing layer 7, and the cap layer 8 are sequentially laminated on the substrate 30 to form a laminated film. Each layer is, for example, formed through sputtering.

Subsequently, the laminated film is annealed. An annealing temperature is, for example, 250° C. or higher and 450° C. or lower. Subsequently, the laminated film is processed into a prescribed columnar body through photolithography and etching. The columnar body may be cylindrical or prismatic. For example, the width of the columnar body when viewed from the lamination direction may be 10 nm or more and 2000 nm or less or may be 30 nm or more and 500 nm or less.

Subsequently, the insulating layer 40 is formed to cover the side surface of the columnar body. The insulating layer 40 may be laminated multiple times. Subsequently, the upper surface of the cap layer 8 is exposed from the insulating layer 40 through chemical mechanical polishing (CMP) and the first electrode 11 is formed on the cap layer 8.

Subsequently, the cladding 25 is formed to cover the periphery of the first electrode 11. Subsequently, the height positions of the upper surfaces of the first electrode 11 and the cladding 25 are aligned through chemical mechanical polishing (CMP). Subsequently, the core 21 is formed at a position partially overlapping the first electrode 11. After a layer serving as the core 21 is laminated, the core 21 is formed by processing it in a prescribed shape through photolithography and etching. Subsequently, the cladding 25 is formed to cover the core 21. Subsequently, the via wirings 51 and 52 are formed by forming through holes in the cladding 25 and filling the insides thereof with conductors.

As described above, the magnetic element 10 and the optical waveguide 20 can be formed on the same substrate 30 in, for example, a vacuum deposition process.

Next, an operation of the light detection element 100 will be described. Light emitted from the light source is input to the optical waveguide 20. The light input to the optical waveguide 20 is light having a change in an intensity and includes, for example, an optical signal having a change in an intensity of light. This light is used, for example, in optical communication systems. Light input to the optical waveguide 20 propagates through the core 21 of the optical waveguide 20. Light propagating through the core 21 is reflected toward the magnetic element 10 by the tilted reflective surface 24.

Figure 6:
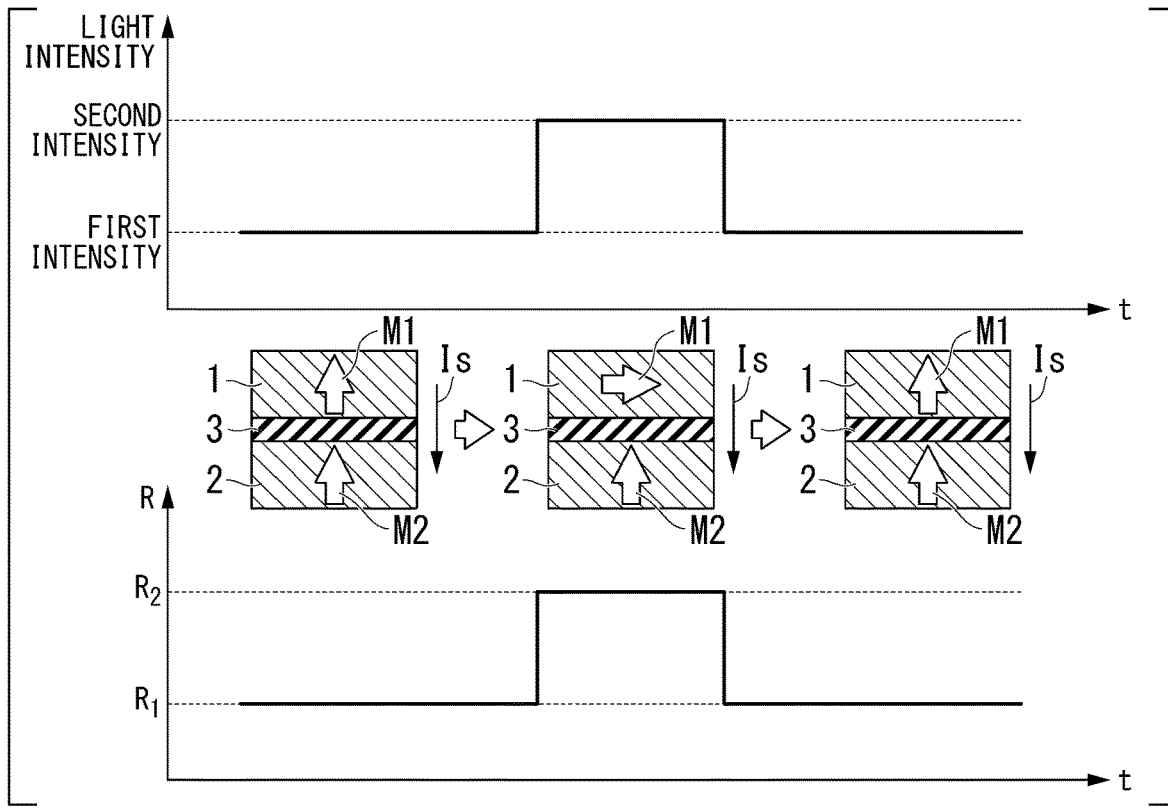
FIG. 6 is a diagram for describing a first mechanism of a first operation example of the magnetic element according to the first embodiment.
Figure 7:
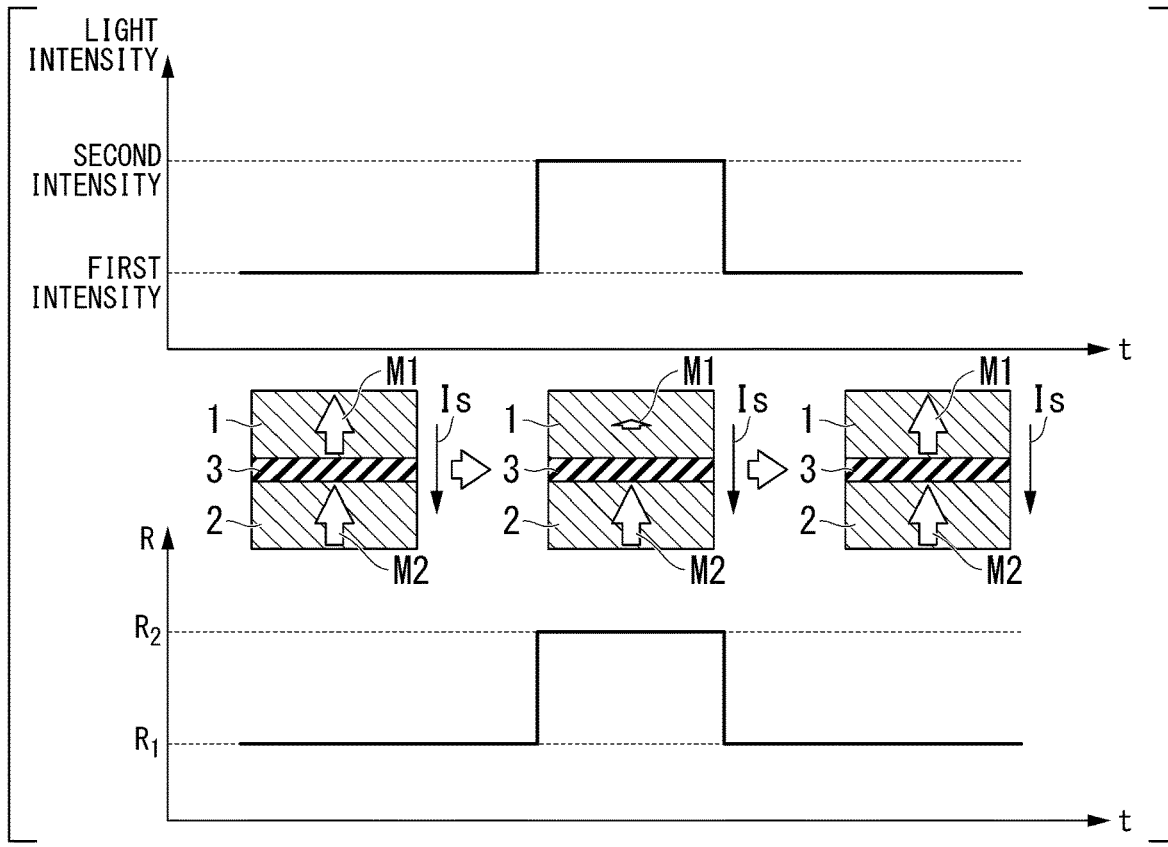
FIG. 7 is a diagram for describing a second mechanism of the first operation example of the magnetic element according to the first embodiment.

The light reflected by the tilted reflective surface 24 is applied to the magnetic element 10. The resistance value of the magnetic element 10 in the z-direction changes when the light that has propagated through the optical waveguide 20 is applied to the first ferromagnetic layer 1. An example in which the intensity of light applied to the first ferromagnetic layer 1 has two levels of a first intensity and a second intensity will be described. It is assumed that the second intensity is greater than the first intensity. The first intensity may correspond to the case where the intensity of the light applied to the first ferromagnetic layer 1 is zero. FIGS. 6 and 7 are diagrams for describing a first operation example of the magnetic element 10. FIG. 6 is a diagram for describing a first mechanism of the first operation example and FIG. 7 is a diagram for describing a second mechanism of the first operation example. In FIGS. 6 and 7, only the first ferromagnetic layer 1, the second ferromagnetic layer 2, and the spacer layer 3 of the magnetic element 10 are extracted and illustrated. In the upper graphs of FIGS. 6 and 7, the vertical axis represents an intensity of light applied to the first ferromagnetic layer 1 and the horizontal axis represents time. In the lower graphs of FIGS. 6 and 7, the vertical axis represents a resistance value of the magnetic element 10 in the z-direction and the horizontal axis represents time.

First, in a state in which light of the first intensity is applied to the first ferromagnetic layer 1 (hereinafter referred to as an initial state), magnetization M1 of the first ferromagnetic layer 1 is parallel to magnetization M2 of the second ferromagnetic layer 2 and a resistance value of the magnetic element 10 in the z-direction is a first resistance value $R_1$, and a magnitude of an output voltage from the magnetic element 10 indicates a first value. The resistance value of the magnetic element 10 in the z-direction is obtained by causing a sense current Is to flow through the magnetic element in the z-direction to generate a voltage across both ends of the magnetic element 10 in the z-direction and using Ohm's law from a voltage value. An output voltage from the magnetic element 10 is generated between the first electrode 11 and the second electrode 12. In the case of the example shown in FIG. 6, the sense current Is flows in a direction from the first ferromagnetic layer 1 to the second ferromagnetic layer 2. By causing the sense current Is to flow in the above direction, spin-transfer torque in a direction, which is the same as that of the magnetization M2 of the second ferromagnetic layer 2, acts on the magnetization M1 of the first ferromagnetic layer 1, and the magnetization M1 becomes parallel to the magnetization M2 in the initial state. In the example shown in FIG. 6, both the direction of the magnetization M1 and the direction of the magnetization M2 are in the +z-direction in the initial state. Also, it is possible to prevent the magnetization M1 of the first ferromagnetic layer 1 from being inverted during operation by causing the sense current Is to flow in the above direction.

Next, the intensity of the light applied to the first ferromagnetic layer 1 changes from the first intensity to the second intensity. The second intensity is greater than the first intensity and the magnetization M1 of the first ferromagnetic layer 1 changes from the initial state. The state of the magnetization M1 of the first ferromagnetic layer 1 in the state in which no light is applied to the first ferromagnetic layer 1 is different from the state of the magnetization M1 of the first ferromagnetic layer 1 when light of the second intensity is applied to the first ferromagnetic layer 1. The state of the magnetization M1 is, for example, a tilt angle for the z-direction, a magnitude, or the like.

For example, as shown in FIG. 6, when the intensity of the light applied to the first ferromagnetic layer 1 changes from the first intensity to the second intensity, the magnetization M1 is tilted in the z-direction. Also, for example, as shown in FIG. 7, when the intensity of the light applied to the first ferromagnetic layer 1 changes from the first intensity to the second intensity, the magnitude of the magnetization M1 becomes small. For example, when the magnetization M1 of the first ferromagnetic layer 1 is tilted in the z-direction due to an intensity of the applied light, a tilt angle thereof is larger than 0° and smaller than 90°.

When the magnetization M1 of the first ferromagnetic layer 1 changes from the initial state, the resistance value of the magnetic element 10 in the z-direction is a second resistance value $R_2$ and a magnitude of the output voltage from the magnetic element 10 is a second value. The second resistance value $R_2$ is larger than the first resistance value $R_1$ and the second value of the output voltage is larger than the first value. The second resistance value $R_2$ is between the resistance value (the first resistance value $R_1$) when the magnetization M1 and the magnetization M2 are parallel and the resistance value when the magnetization M1 and the magnetization M2 are antiparallel.

In the case shown in FIG. 6, spin-transfer torque in a direction, which is the same as that of the magnetization M2 of the second ferromagnetic layer 2, acts on the magnetization M1 of the first ferromagnetic layer 1. Therefore, the magnetization M1 tries to return to a state in which the magnetization M1 is parallel to the magnetization M2 and the magnetization M1 returns to a state in which the magnetization M1 is parallel to the magnetization M2 when the intensity of the light applied to the first ferromagnetic layer 1 changes from the second intensity to the first intensity. In the case shown in FIG. 7, when the intensity of the light applied to the first ferromagnetic layer 1 returns to the first intensity, the magnitude of the magnetization M1 of the first ferromagnetic layer 1 returns to the magnitude of the initial state. In either case, the resistance value of the magnetic element 10 in the z-direction returns to the first resistance value $R_1$. That is, when the intensity of the light applied to the first ferromagnetic layer 1 changes from the second intensity to the first intensity, the resistance value of the magnetic element 10 in the z-direction changes from the second resistance value $R_2$ to the first resistance value $R_1$ and the magnitude of the output voltage from the magnetic element 10 changes from the second value to the first value.

The output voltage from the magnetic element 10 changes in correspondence with a change in the intensity of the light applied to the first ferromagnetic layer 1 and the change in the intensity of the applied light can be transformed into a change in the output voltage from the magnetic element 10. That is, the magnetic element 10 can replace the light with an electrical signal. For example, in the receiving device for the optical signal, the case where the output voltage from the magnetic element 10 is greater than or equal to a threshold value is treated as a first signal (for example, "1") and the case where the output voltage is less than the threshold value is treated as a second signal (for example, "0").

Although the case where the magnetization M1 is parallel to the magnetization M2 in the initial state has been described as an example here, the magnetization M1 may be antiparallel to the magnetization M2 in the initial state. In this case, the resistance value of the magnetic element 10 in the z-direction decreases as the state of the magnetization M1 changes (for example, as the change in the angle of the magnetization M1 increases from the initial state). When the initial state is the case where the magnetization M1 is antiparallel to the magnetization M2, the sense current is may flow in a direction from the second ferromagnetic layer 2 to the first ferromagnetic layer 1. By causing the sense current Is to flow in the above direction, spin-transfer torque in a direction opposite to that of the magnetization M2 of the second ferromagnetic layer 2 acts on the magnetization M1 of the first ferromagnetic layer 1 and the magnetization M1 becomes antiparallel to the magnetization M2 in the initial state.

In the first operation example, the case where the light applied to the first ferromagnetic layer 1 has two levels of the first intensity and the second intensity has been described as an example, but in the second operation example, the case where the intensity of the light applied to the first ferromagnetic layer 1 changes at multiple levels or in an analog manner will be described.

Figure 8:
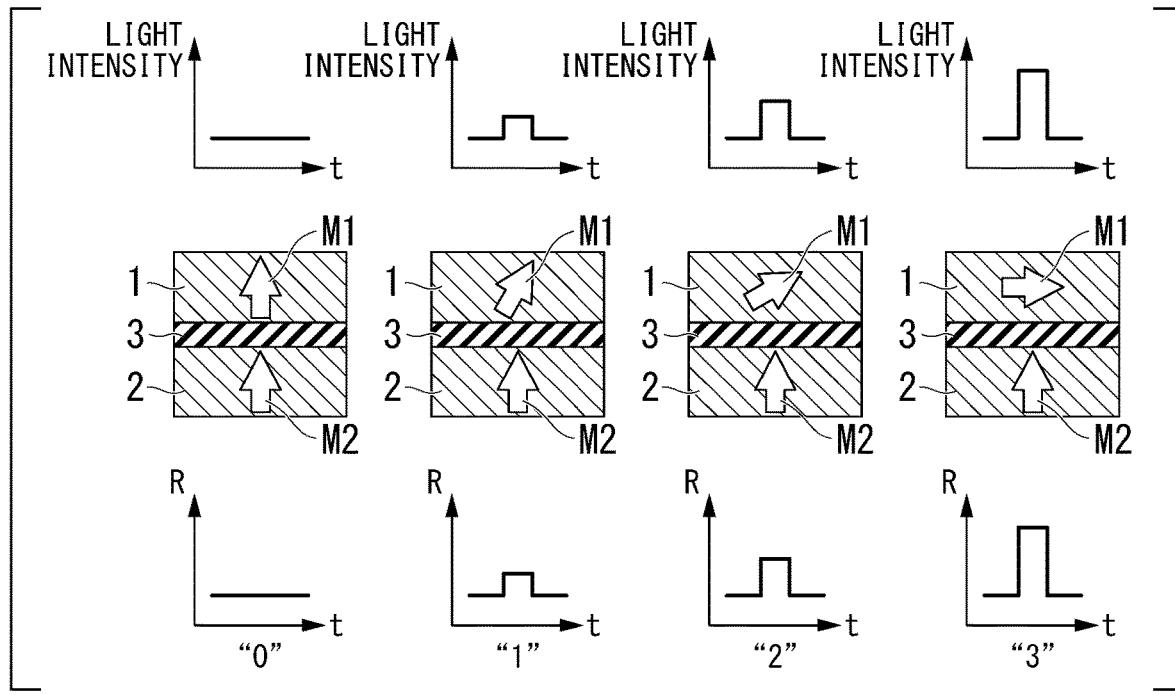
FIG. 8 is a diagram for describing a first mechanism of a second operation example of the magnetic element according to the first embodiment.
Figure 9:
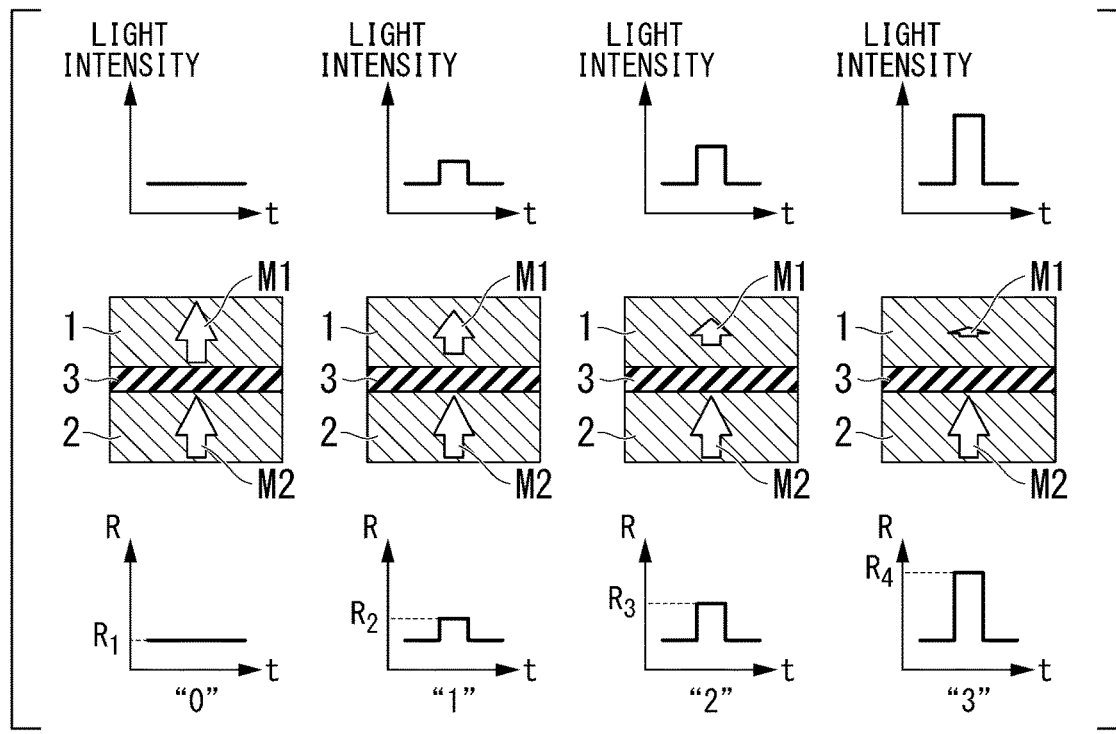
FIG. 9 is a diagram for describing a second mechanism of the second operation example of the magnetic element according to the first embodiment.

FIGS. 8 and 9 are diagrams for describing a second operation example of the magnetic element 10 according to the first embodiment. FIG. 8 is a diagram for describing a first mechanism of the second operation example and FIG. 9 is a diagram for describing a second mechanism of the second operation example. In FIGS. 8 and 9, only the first ferromagnetic layer 1, the second ferromagnetic layer 2, and the spacer layer 3 of the magnetic element 10 are extracted and illustrated. In the upper graphs of FIGS. 8 and 9, the vertical axis represents an intensity of light applied to the first ferromagnetic layer 1 and the horizontal axis represents time. In the lower graphs of FIGS. 8 and 9, the vertical axis represents a resistance value of the magnetic element 10 in the z-direction and the horizontal axis represents time. In the example shown in FIG. 8, both the direction of the magnetization M1 and the direction of the magnetization M2 are in the +z-direction in the initial state.

In the case of FIG. 8, when the intensity of the light applied to the first ferromagnetic layer 1 increases, the magnetization M1 of the first ferromagnetic layer 1 is tilted from the initial state due to external energy generated by the application of the light. An angle between the direction of the magnetization M1 of the first ferromagnetic layer 1 when no light is applied to the first ferromagnetic layer 1 and the direction of the magnetization M1 when light is applied is greater than 0° and less than 90°.

When the magnetization M1 of the first ferromagnetic layer 1 is tilted from the initial state, the resistance value of the magnetic element 10 in the z-direction changes. The output voltage from the magnetic element 10 changes. For example, the resistance value of the magnetic element 10 in the z-direction changes to a second resistance value $R_2$, a third resistance value $R_3$, and a fourth resistance value $R_4$ in accordance with the tilt of the magnetization M1 of the first ferromagnetic layer 1 and the output voltage from the magnetic element 10 changes to a second value, a third value, and a fourth value. The resistance value increases in the order of the first resistance value $R_1$, the second resistance value $R_2$, the third resistance value $R_3$, and the fourth resistance value $R_4$. The output voltage from the magnetic element 10 increases in the order of the first value, the second value, the third value, and the fourth value.

In the magnetic element 10, when the intensity of the light applied to the first ferromagnetic layer 1 has changed, the output voltage from the magnetic element 10 (the resistance value of the magnetic element 10 in the z-direction) changes. For example, when the first value (the first resistance value $R_1$) is defined as "0," the second value (second resistance value $R_2$) is defined as "1," the third value (third resistance value $R_3$) is defined as "2," and the fourth value (fourth resistance value $R_4$) is defined as "3," the magnetic element 10 can read information of four values. Although the case where four values are read is shown as an example here, the number of values to be read can be freely designed by setting the threshold value of the output voltage from the magnetic element 10 (the resistance value of the magnetic element 10). Also, the magnetic element 10 may use an analog value as it is.

Likewise, in the case of FIG. 9, when the intensity of the light applied to the first ferromagnetic layer 1 increases, the magnitude of the magnetization M1 of the first ferromagnetic layer 1 decreases from the initial state due to external energy when light is applied. When the magnetization M1 of the first ferromagnetic layer 1 decreases from the initial state, the resistance value of the magnetic element 10 in the z-direction changes. The output voltage from the magnetic element 10 changes. For example, in the accordance with the magnitude of the magnetization M1 of the first ferromagnetic layer 1, the resistance value of the magnetic element 10 in the z-direction changes to a second resistance value $R_2$, a third resistance value $R_3$, and a fourth resistance value $R_4$ and the output voltage from the magnetic element 10 changes to a second value, a third value, and a fourth value. Therefore, as in the case of FIG. 8, the light detection element 100 can output the difference in these output voltages (resistance values) as multivalued or analog data.

Even in the case of the second operation example, as in the first operation example, when the intensity of the light applied to the first ferromagnetic layer 1 returns to the first intensity, the state of the magnetization M1 of the first ferromagnetic layer 1 returns to the initial state. According to the second operation example, the light detection element 100 can be used as an element that detects a light intensity as multivalued or analog data and can be applied to an optical sensor device such as an image sensor as well as an optical communication system.

Although the case where the magnetization M1 and the magnetization M2 are parallel in the initial state has been described here as an example, the magnetization M1 and the magnetization M2 may be antiparallel in the initial state even in the second operation example.

Although the magnetization M1 and the magnetization M2 are parallel or antiparallel in the initial state in the first operation example and the second operation example, the magnetization M1 and the magnetization M2 may be orthogonal in the initial state. For example, this case corresponds to a case where the first ferromagnetic layer 1 is an in-plane magnetization film in which the magnetization M1 is oriented in any one direction of the xy-plane and the second ferromagnetic layer 2 is a perpendicular magnetization film in which the magnetization M2 is oriented in the z-direction in the initial state. Due to the magnetic anisotropy, the magnetization M1 is oriented in any one direction within the xy-plane and the magnetization M2 is oriented in the z-direction, such that the magnetization M1 and the magnetization M2 are orthogonal to each other in the initial state.

Figure 10:
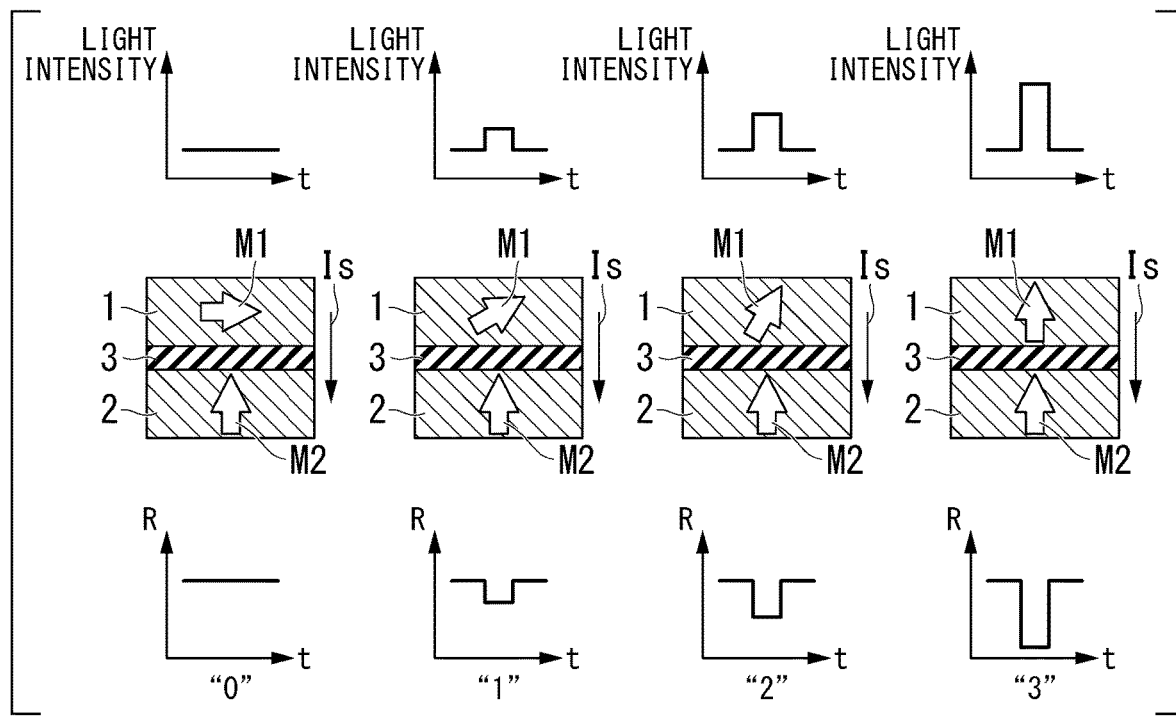
FIG. 10 is a diagram for describing another example of the second operation example of the magnetic element according to the first embodiment.
Figure 11:
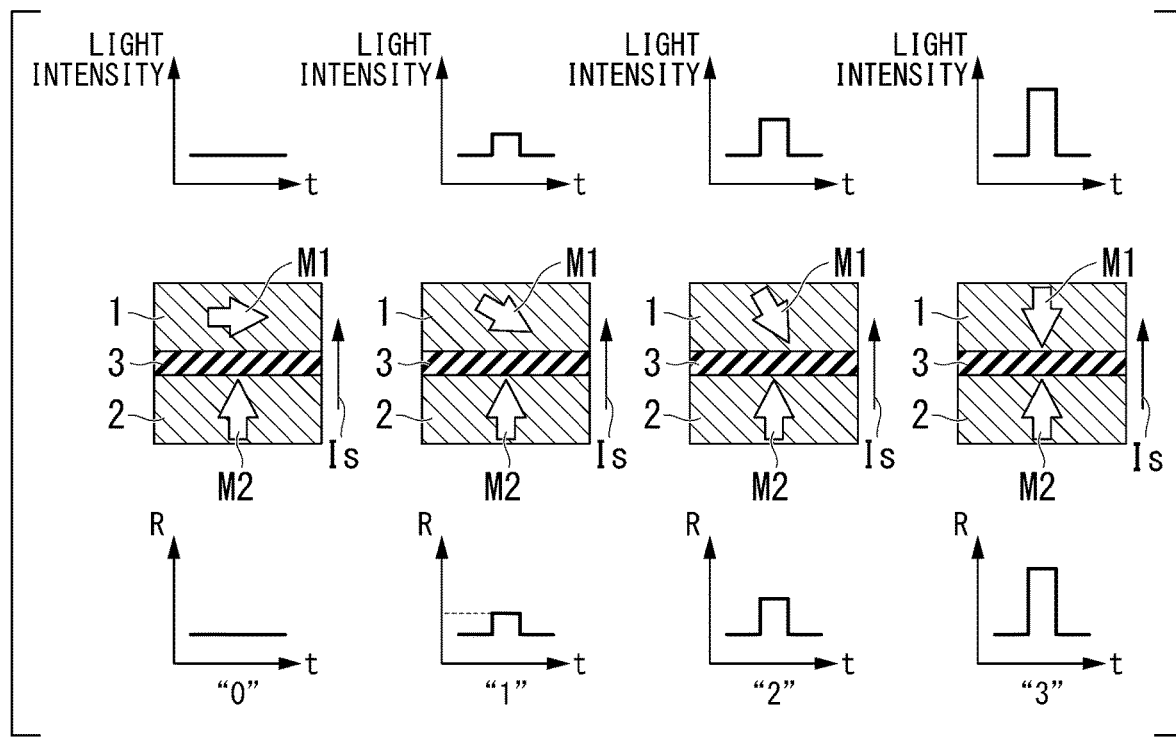
FIG. 11 is a diagram for describing yet another example of the second operation example of the magnetic element according to the first embodiment.

FIGS. 10 and 11 are diagrams for describing another example of the second operation example of the magnetic element 10 according to the first embodiment. In FIGS. 10 and 11, only the first ferromagnetic layer 1, the second ferromagnetic layer 2, and the spacer layer 3 of the magnetic element 10 are extracted and illustrated. In FIGS. 10 and 11, the flow direction of the sense current Is applied to the magnetic element 10 is different. In FIG. 10, the sense current Is flows from the first ferromagnetic layer 1 to the second ferromagnetic layer 2. In FIG. 11, the sense current Is flows from the second ferromagnetic layer 2 to the first ferromagnetic layer 1.

In both cases of FIGS. 10 and 11, spin-transfer torque acts on the magnetization M1 in the initial state due to the sense current Is flowing through the magnetic element 10. In the case of FIG. 10, the spin-transfer torque acts such that the magnetization M1 is parallel to the magnetization M2 of the second ferromagnetic layer 2. In the case of FIG. 11, the spin-transfer torque acts such that the magnetization M1 is antiparallel to the magnetization M2 of the second ferromagnetic layer 2. In both cases of FIGS. 10 and 11, because the effect of magnetic anisotropy on the magnetization M1 is greater than the effect of the spin-transfer torque in the initial state, the magnetization M1 is oriented in any one direction within the xy-plane.

When the intensity of the light applied to the first ferromagnetic layer 1 increases, the magnetization M1 of the first ferromagnetic layer 1 is tilted from the initial state due to external energy when light is applied. This is because the sum of the effect of the light applied to the magnetization M1 and the effect of the spin-transfer torque is greater than the effect of the magnetic anisotropy associated with the magnetization M1. When the intensity of the light applied to the first ferromagnetic layer 1 increases, the magnetization M1 in the case of FIG. 10 is tilted such that it is parallel to the magnetization M2 of the second ferromagnetic layer 2 and the magnetization M1 in the case of FIG. 11 is tilted such that it is antiparallel to the magnetization M2 of the second ferromagnetic layer 2. Because the direction of the spin-transfer torque acting on the magnetization M1 is different, the tilt direction of the magnetization M1 in FIGS. 10 and 11 is different.

When the intensity of light applied to the first ferromagnetic layer 1 increases, the resistance value of the magnetic element 10 decreases and the output voltage from the magnetic element 10 decreases in the case of FIG. 10. In the case of FIG. 11, the resistance value of the magnetic element 10 increases and the output voltage from the magnetic element 10 increases.

When the intensity of the light applied to the first ferromagnetic layer 1 returns to the first intensity, the state of the magnetization M1 of the first ferromagnetic layer 1 returns to the initial state due to the effect of the magnetic anisotropy on the magnetization M1.

Here, an example in which the first ferromagnetic layer 1 is an in-plane magnetization film and the second ferromagnetic layer 2 is a perpendicular magnetization film has been described, but the relationship may be reversed. That is, in the initial state, the magnetization M1 may be oriented in the z-direction and the magnetization M2 may be oriented in any one direction within the xy-plane.

The magnetic element 10 replaces light having a change in an intensity with an electrical signal. For example, the electric signal is externally output from the external electrodes 53 and 54. The electrical signal is, for example, an output voltage from the magnetic element 10.

The light detection element 100 according to the first embodiment can replace the light with an electric signal by replacing light propagating through the optical waveguide 20 and applied to the magnetic element 10 with an output voltage from the magnetic element 10.

Also, the magnetization M1 of the first ferromagnetic layer 1 easily changes with the application of light as the volume of the first ferromagnetic layer 1 decreases. In other words, the magnetization M1 of the first ferromagnetic layer 1 is more likely to be tilted or reduced due to the application of light when the volume of the first ferromagnetic layer 1 is smaller. In other words, if the volume of the first ferromagnetic layer 1 is reduced, even a small amount of light can change the magnetization M1.

More precisely, the changeability of the magnetization M1 is determined by a magnitude of the product (KuV) of the magnetic anisotropy (Ku) of the first ferromagnetic layer 1 and the volume (V). The magnetization M1 changes with a smaller amount of light when KuV is smaller and the magnetization M1 does not change if an amount of light is not larger when KuV is larger. That is, KuV of the first ferromagnetic layer 1 is designed in accordance with an amount of light applied from the outside in an application use. Assuming that an extremely small amount of light or a photon is detected, it is possible to detect such a small amount of light by reducing KuV of the first ferromagnetic layer 1. Detection of such a small amount of light is a great advantage because it becomes difficult in conventional pn junction semiconductors when the size of the element is reduced. In other words, photon detection is also enabled by reducing the volume of the first ferromagnetic layer 1, i.e., by reducing the area of the element or reducing the thickness of the first ferromagnetic layer 1 in order to reduce KuV.

Also, the light detection element 100 according to the first embodiment can detect light regardless of the wavelength range of the light to be applied. A suitable semiconductor material for a semiconductor photodetector using a pn junction differs according to a wavelength of light to be applied. For example, InGaAs or the like is used for detecting near-infrared light with a wavelength of 1.3 μm or more and 1.5 μm or less. Also, for example, silicon is used for detecting visible light with a wavelength of 400 nm or more and 800 nm or less. On the other hand, the light detection element 100 according to the first embodiment can detect light with high sensitivity regardless of the wavelength of light such as visible light and near-infrared light.

In the light detection element 100 according to the first embodiment, the optical waveguide 20 through which light propagates and the magnetic element 10 for converting the light into an electric signal are formed on the same substrate 30 and can be collectively formed. Also, the light detection element 100 according to the first embodiment can be handled as one packaged electronic component.

Second Embodiment

Figure 12:
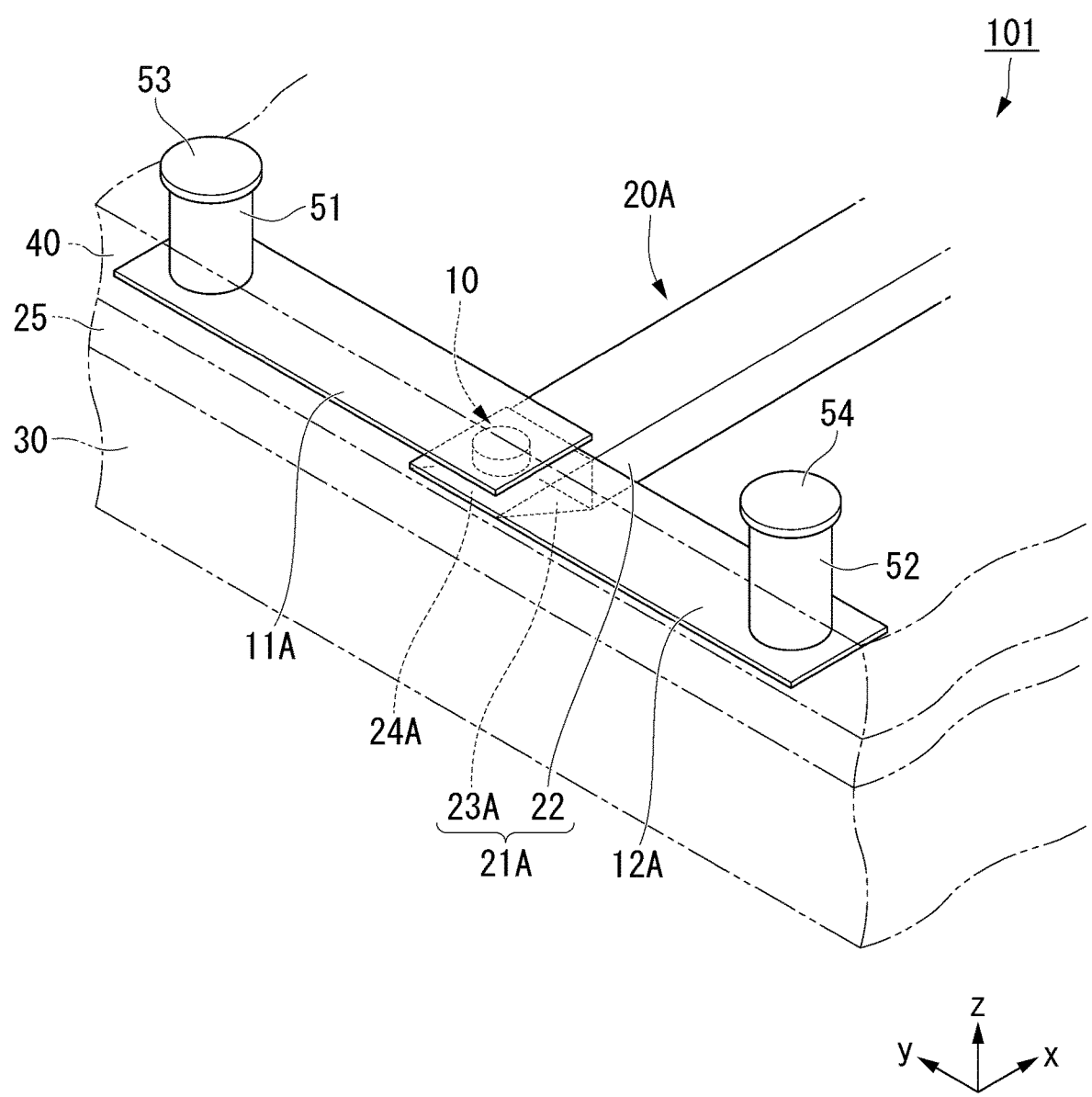
FIG. 12 is a perspective view of a light detection element according to a second embodiment.
Figure 13:
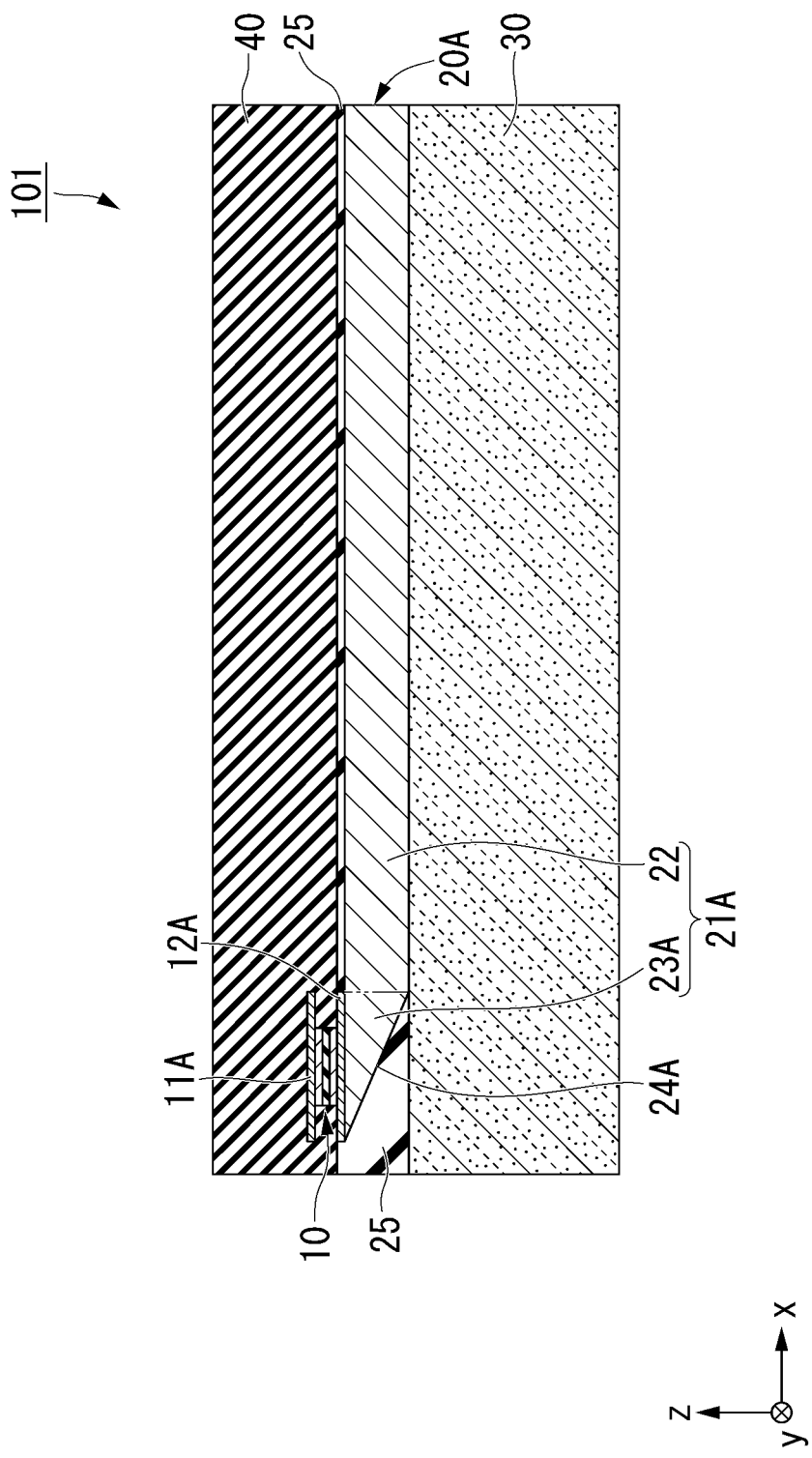
FIG. 13 is a cross-sectional view of the light detection element according to the second embodiment.
Figure 14:
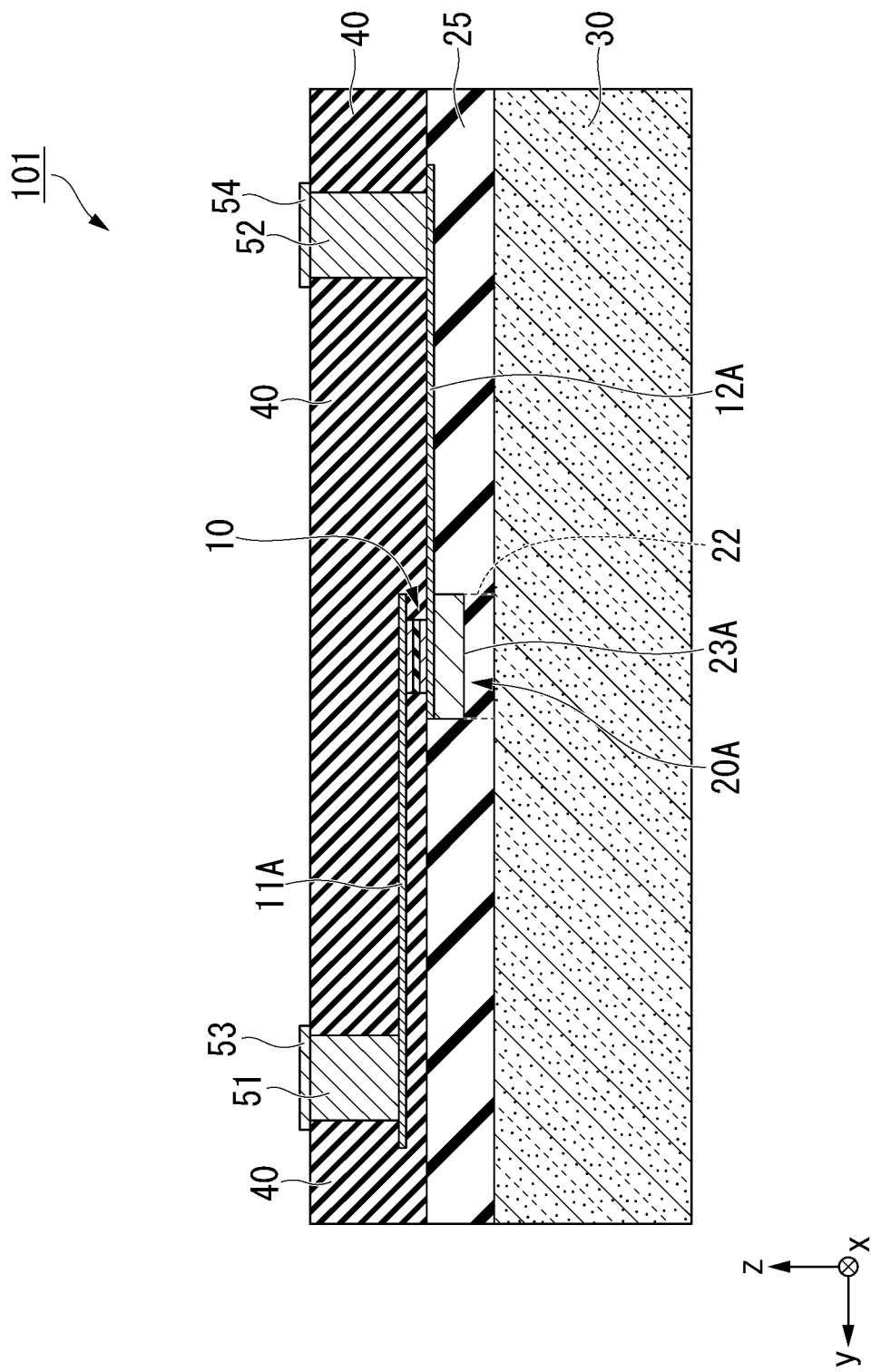
FIG. 14 is a cross-sectional view of the light detection element according to the second embodiment.

FIG. 12 is a perspective view of a light detection element 101 according to a second embodiment. FIGS. 13 and 14 are cross-sectional views of the light detection element 101 according to the second embodiment. FIG. 13 is an xz cross-section passing through the center of a core 21A in a width direction. FIG. 14 is a yz cross-section passing through the center of a magnetic element 10.

The light detection element 101 has, for example, a magnetic element 10, a first electrode 11A, a second electrode 12A, an optical waveguide 20A, a substrate 30, and an insulating layer 40. Light that has propagated through the optical waveguide 20A is applied to the magnetic element 10. In the light detection element 101 according to the second embodiment, components similar to those of the light detection element 100 according to the first embodiment are denoted by similar reference signs and description thereof is omitted.

Light emitted from a light source propagates through the optical waveguide 20A. The light propagating through the optical waveguide 20A is similar to the light propagating through the optical waveguide 20 according to the first embodiment.

The optical waveguide 20A includes at least a core 21A and a cladding 25. At least a part of the core 21A is covered with the cladding 25. A material constituting the core 21A is similar to that of the core 21 according to the first embodiment.

The core 21A is in contact with a substrate 30. For example, a lower surface of the core 21A is in contact with the substrate 30. Light is reflected at an interface between the substrate 30 and the core 21A and the substrate 30 constitutes a part of the cladding 25. A refractive index of the substrate 30 is smaller than that of the core 21A.

The core 21A includes, for example, a main part 22 and a first part 23A. The first part 23A is connected to the main part 22. The optical waveguide 20A includes a tilted reflective surface 24A. The tilted reflective surface 24A is a part of an interface between the first part 23A, which is a part of the core 21A, and the cladding 25. The tilted reflective surface 24A intersects a lamination direction of the magnetic element 10 and the first direction described above. The light propagating through the main part 22 and reflected by the tilted reflective surface 24A is applied from the second electrode 12A side to the magnetic element 10. The light applied to the magnetic element 10 is transmitted through each layer constituting the magnetic element 10 and applied to the first ferromagnetic layer 1. A position of the tilted reflective surface 24A in the z-direction (the lamination direction of the magnetic element 10) is different from a position of the magnetic element 10 in the z-direction. The tilted reflective surface 24A is located, for example, at a position overlapping the magnetic element 10 when viewed from the lamination direction of the magnetic element 10. For example, the tilted reflective surface 24A is located below the magnetic element 10 in the z-direction.

The magnetic element 10 and the optical waveguide 20A are located, for example, on the substrate 30. The position of the tilted reflective surface 24A in the z-direction is located between the position of the magnetic element 10 in the z-direction and the position of the substrate 30 in the z-direction. For example, at least a part of the tilted reflective surface 24A is sandwiched between the magnetic element 10 and the substrate 30 in the z-direction. The magnetic element 10 is located at a position where light that has propagated through the optical waveguide 20A is applied (a position where light reflected by the tilted reflective surface 24A is applied) and located, for example, above the tilted reflective surface 24A.

Each of the first electrode 11A and the second electrode 12A is electrically connected to, for example, the magnetic element 10. The first electrode 11A is connected to a via wiring 51. The second electrode 12A is connected to a via wiring 52. At least a part of the second electrode 12A is sandwiched between the magnetic element and the first part 23A. Also, the second electrode 12 is in contact with, for example, the first part 23A of the core 21A. The configuration of the second electrode 12A is similar to the configuration of the first electrode 11 in the first embodiment. The configuration of the first electrode 11A is similar to the configuration of the second electrode 12 in the first embodiment. When the second electrode 12A is in contact with the core 21A, an absolute value of a refractive index difference between the second electrode 12A and the core 21A may be smaller than an absolute value of a refractive index difference between the core 21A and the cladding 25. When the condition of the refractive index difference described above is satisfied, reflection of light that has propagated through the core 21A at an interface between the core 21A and the second electrode 12A can be suppressed and most of the light that has propagated through the core 21A can be applied to the magnetic element 10. The refractive index of the second electrode 12A may be smaller than the refractive index of the core 21A, the refractive index of the second electrode 12A may be larger than the refractive index of the core 21A, or the refractive index of the second electrode 12A may be the same as the refractive index of the core 21A.

Next, a method for manufacturing the light detection element 101 will be described. First, a layer serving as the core 21A is formed on the substrate 30. For example, a lithium niobate crystal is grown on a single crystal substrate of sapphire. Subsequently, the formed layer is processed in a prescribed shape through photolithography and etching to form the core 21A.

Next, the second electrode 12A, an underlayer 6, a third ferromagnetic layer 4, a magnetic coupling layer 5, a second ferromagnetic layer 2, a spacer layer 3, the first ferromagnetic layer 1, a perpendicular magnetization inducing layer 7, and a cap layer 8 are laminated in that order on the first part 23A of the core 21A to form a laminated film. After the laminated film is annealed, it is processed into a prescribed columnar body to manufacture the magnetic element 10. Subsequently, the first electrode 11A is manufactured on the cap layer 8. The magnetic element 10 can be manufactured regardless of the material forming the base and can be formed on the first part 23A, which is a part of the core 21A, without involving an adhesive layer or the like.

Subsequently, the cladding 25 is formed to cover the core 21A. Subsequently, an insulating layer 40 is formed to cover the magnetic element 10. Subsequently, the via wirings 51 and 52 are formed by forming a through hole in the insulating layer 40 and filling the inside thereof with a conductor and the light detection element 101 is obtained.

Figure 15:
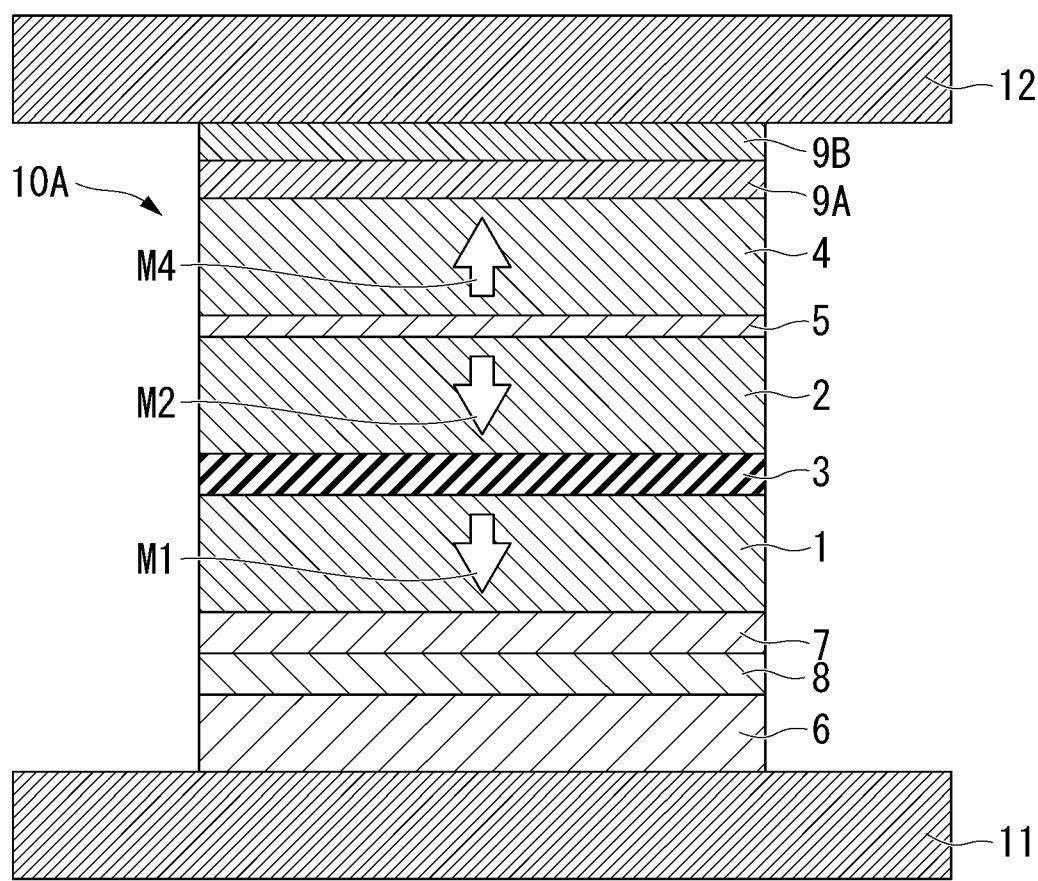
FIG. 15 is a cross-sectional view of a magnetic element according to a modified example of the second embodiment.

Also, FIG. 15 is a cross-sectional view of a magnetic element 10A according to a modified example of the second embodiment. The magnetic element 10A can be replaced with the magnetic element 10 of the light detection element 101 described above. At this time, the magnetic element 10A is arranged such that the first electrode 11 is closer to the first part 23A than the second electrode 12 is and at least a part of the first electrode 11 is sandwiched between the magnetic element 10A and the first part 23A. The light reflected by the tilted reflective surface 24A is applied from the first electrode 11 side to the magnetic element 10A. In this case, the first electrode 11 is in contact with, for example, the first part 23A of the core 21A. When the first electrode 11 is in contact with the core 21A, an absolute value of a refractive index difference between the first electrode 11 and the core 21A may be smaller than an absolute value of a refractive index difference between the core 21A and the cladding 25. The refractive index of the first electrode 11 may be smaller than the refractive index of the core 21A, the refractive index of the first electrode 11 may be larger than the refractive index of the core 21A, or the refractive index of the first electrode 11 may be the same as the refractive index of the core 21A.

The magnetic element 10A has at least the first ferromagnetic layer 1, the second ferromagnetic layer 2, and the spacer layer 3. The spacer layer 3 is located between the first ferromagnetic layer 1 and the second ferromagnetic layer 2. The magnetic element 10A also has, for example, the third ferromagnetic layer 4, the magnetic coupling layer 5, the underlayer 6, the perpendicular magnetization inducing layer 7, the cap layer 8, a seed layer 9A, and a buffer layer 9B in addition to these.

The lamination order of the cap layer 8, the perpendicular magnetization inducing layer 7, the first ferromagnetic layer 1, the spacer layer 3, the second ferromagnetic layer 2, the magnetic coupling layer 5, and the third ferromagnetic layer 4 in the magnetic element 10A is opposite to the lamination order in the magnetic element 10. In the magnetic element 10A, unlike the magnetic element 10, an underlayer 6 is located between the cap layer 8 and the first electrode 11, and the underlayer 6, the cap layer 8, the perpendicular magnetization inducing layer 7, the first ferromagnetic layer 1, the spacer layer 3, the second ferromagnetic layer 2, the magnetic coupling layer 5, the third ferromagnetic layer 4, the seed layer 9A, and the buffer layer 9B are laminated in that order from the first electrode 11 side between the first electrode 11 and the second electrode 12. The seed layer 9A and the buffer layer 9B can be made of materials similar to those of the seed layer and the buffer layer of the underlayer 6.

The operation of the light detection element 101 is similar to that of the light detection element 100. The light detection element 101 according to the second embodiment can replace light with an electric signal by replacing the light propagating through the optical waveguide 20A and applied to the magnetic element 10 with an output voltage from the magnetic element 10. The light detection element 101 according to the second embodiment has effects similar to those of the light detection element 100 according to the first embodiment.

Third Embodiment

Figure 16:
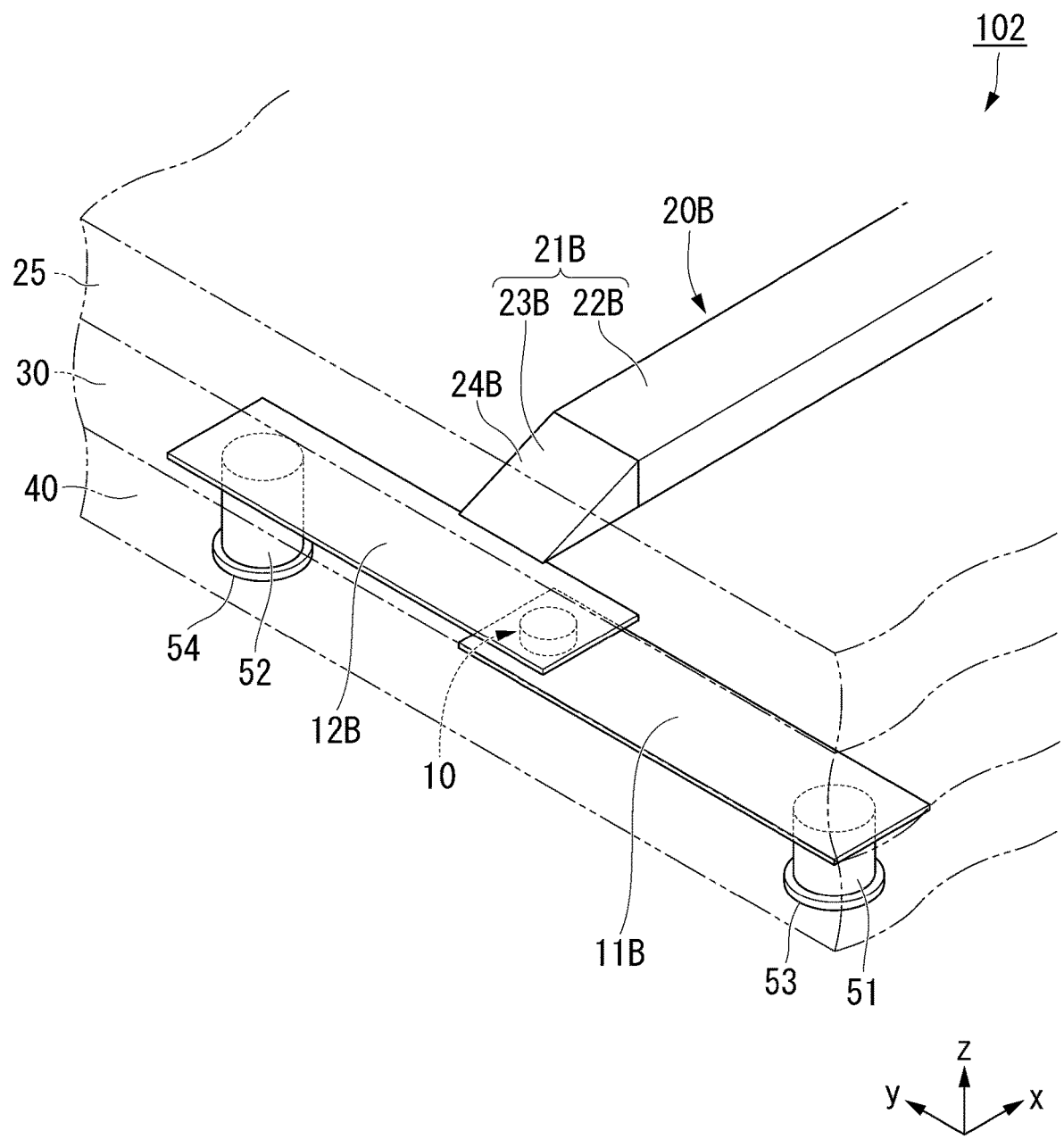
FIG. 16 is a perspective view of a light detection element according to a third embodiment.
Figure 17:
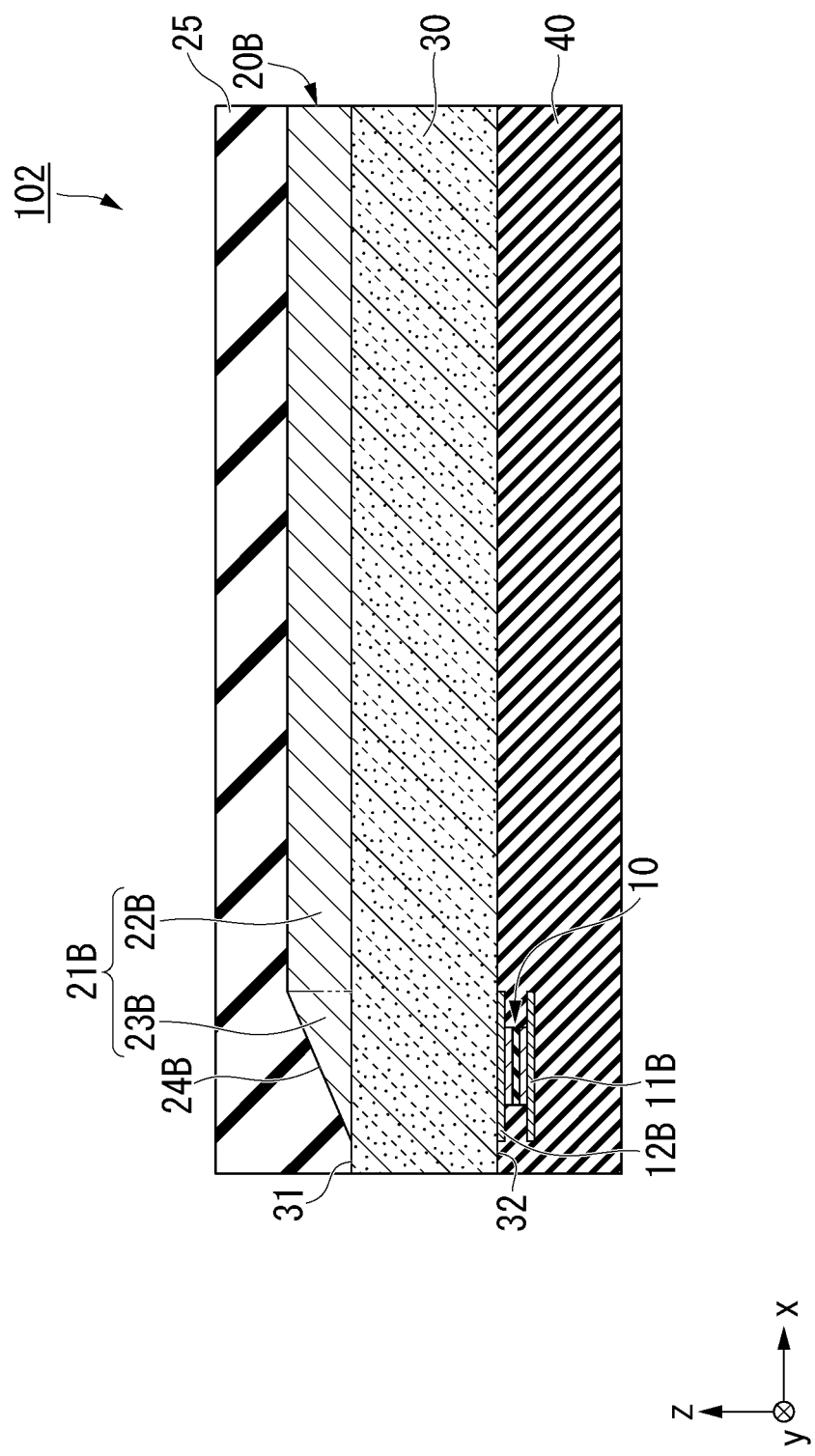
FIG. 17 is a cross-sectional view of the light detection element according to the third embodiment.
Figure 18:
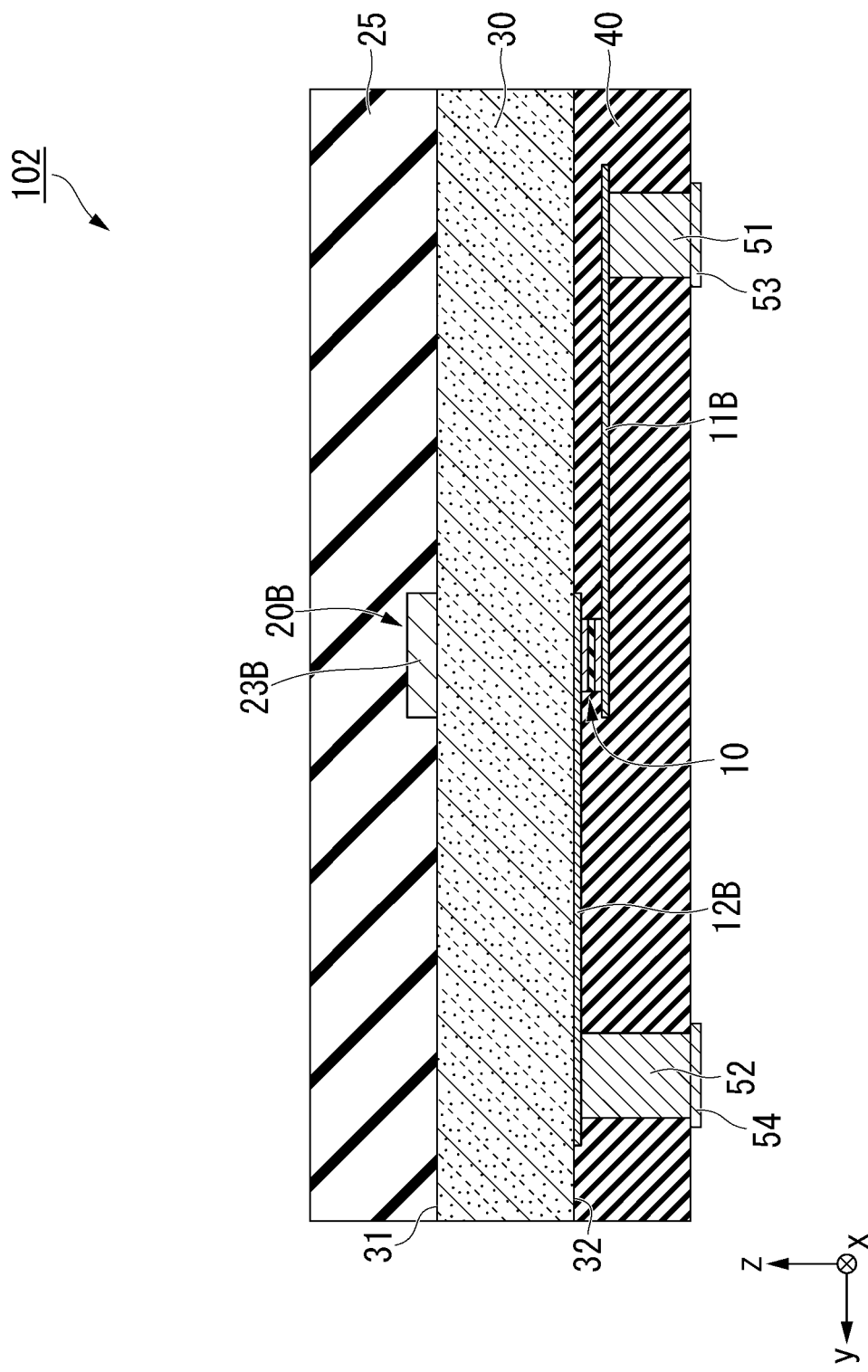
FIG. 18 is a cross-sectional view of the light detection element according to the third embodiment.

FIG. 16 is a perspective view of a light detection element 102 according to a third embodiment. FIGS. 17 and 18 are cross-sectional views of the light detection element 102 according to the third embodiment. FIG. 17 is an xz cross-section passing through the center of a core 21B in a width direction. FIG. 18 is a yz cross-section passing through the center of a magnetic element 10.

The light detection element 102 has, for example, the magnetic element 10, a first electrode 11B, a second electrode 12B, an optical waveguide 20B, a substrate 30, and an insulating layer 40. In the light detection element 102 according to the third embodiment, components similar to those of the light detection element 100 according to the first embodiment are denoted by similar reference signs and description thereof is omitted.

Light emitted from a light source propagates through the optical waveguide 20B. The light propagating through the optical waveguide 20B is similar to the light propagating through the optical waveguide 20 according to the first embodiment.

The optical waveguide 20B includes at least a core 21B and a cladding 25. A material constituting the core 21B is similar to that of the core 21 according to the first embodiment. The core 21B includes, for example, a main part 22B and a first part 23B. The optical waveguide 20B includes a tilted reflective surface 24B. The first part 23B is connected to the main part 22B.

Both the magnetic element 10 and the optical waveguide 20B are formed on the substrate 30. The substrate 30 has a first surface 31 and a second surface 32 opposite each other in the thickness direction. The optical waveguide 20B is located on the first surface 31 side of the substrate 30. In the magnetic element 10, the core 21B of the optical waveguide 20B located on the second surface 32 side of the substrate 30 is in contact with the substrate 30. For example, the lower surface of the core 21B is in contact with the substrate 30.

Light is reflected at an interface between the substrate 30 and the core 21B and the substrate 30 constitutes a part of the cladding 25. The refractive index of the substrate 30 is smaller than that of the core 21B.

A position of the substrate 30 in the z-direction is located between a position of the tilted reflective surface 24B of the optical waveguide 20 in the z-direction and a position of the magnetic element 10 in the z-direction. For example, a part of the substrate 30 is sandwiched between the tilted reflective surface 24B and the magnetic element 10 in the z-direction. The magnetic element 10 is located at a position where light that has propagated through the optical waveguide 20B is applied (a position where light reflected by the tilted reflective surface 24 is applied) and is located, for example, below the tilted reflective surface 24B. The position of the tilted reflective surface 24B in the z-direction (the lamination direction of the magnetic element 10) is different from the position of the magnetic element 10 in the z-direction. The tilted reflective surface 24B is located, for example, at a position overlapping the magnetic element 10 when viewed from the lamination direction of the magnetic element 10. The light that has propagated through the optical waveguide 20B is reflected by the tilted reflective surface 24B, transmitted through the substrate 30, and applied from the second electrode 12B side to the magnetic element 10. The light applied to the magnetic element 10 is transmitted through each layer constituting the magnetic element 10 and applied to the first ferromagnetic layer 1.

Each of the first electrode 11B and the second electrode 12B is electrically connected to, for example, the magnetic element 10. The first electrode 11B is connected to the via wiring 51. The second electrode 12B is connected to the via wiring 52. At least a part of the second electrode 12B is sandwiched between the magnetic element 10 and the first part 23B. The configuration of the second electrode 12B is similar to the configuration of the first electrode 11 in the first embodiment. The configuration of the first electrode 11B is similar to the configuration of the second electrode 12 in the first embodiment.

Next, a method of manufacturing the light detection element 102 will be described. First, a layer serving as the core 21B is formed on the first surface 31 of the substrate 30. For example, a lithium niobate crystal is grown on a single crystal substrate of sapphire. Subsequently, the formed layer is processed in a prescribed shape through photolithography and etching to form the core 21B. Subsequently, the cladding 25 is formed to cover the core 21B.

Subsequently, the second electrode 12B, the underlayer 6, the third ferromagnetic layer 4, the magnetic coupling layer 5, the second ferromagnetic layer 2, the spacer layer 3, the first ferromagnetic layer 1, the perpendicular magnetization inducing layer 7, and the cap layer 8 are laminated on the second surface 32 of the substrate 30 in that order to form a laminated film. After the laminated film is annealed, it is processed into a prescribed columnar body to manufacture the magnetic element 10. Subsequently, the first electrode 11B is manufactured on the cap layer 8.

Subsequently, an insulating layer 40 is formed to cover the magnetic element 10. Subsequently, the via wirings 51 and 52 are formed and the light detection element 102 is obtained by forming a through hole in the insulating layer 40 and filling the inside thereof with a conductor. Even in the third embodiment, the magnetic element 10 can be replaced with the magnetic element 10A shown in FIG. 15. At this time, the magnetic element 10A is arranged such that the first electrode 11 is closer to the first part 23B than the second electrode 12 is and at least a part of the first electrode 11 is sandwiched between the magnetic element 10A and the first part 23B. The light reflected by the tilted reflective surface 24B from the first electrode 11 side is applied to the magnetic element 10A. In this case, the first electrode 11 is in contact with, for example, the first part 23B of the core 21B. When the first electrode 11 is in contact with the core 21B, an absolute value of a refractive index difference between the first electrode 11 and the core 21B may be smaller than an absolute value of a refractive index difference between the core 21B and the cladding 25. The refractive index of the first electrode 11 may be smaller than the refractive index of the core 21B, the refractive index of the first electrode 11 may be larger than the refractive index of the core 21B, or the refractive index of the first electrode 11 may be the same as the refractive index of the core 21B.

The operation of the light detection element 102 is similar to that of the light detection element 100. The light detection element 102 according to the third embodiment can replace light with an electric signal by replacing the light propagating through the optical waveguide 20 and applied to the magnetic element 10 with an output voltage from the magnetic element 10. The light detection element 102 according to the third embodiment has effects similar to those of the light detection element 100 according to the first embodiment.

Figure 19:
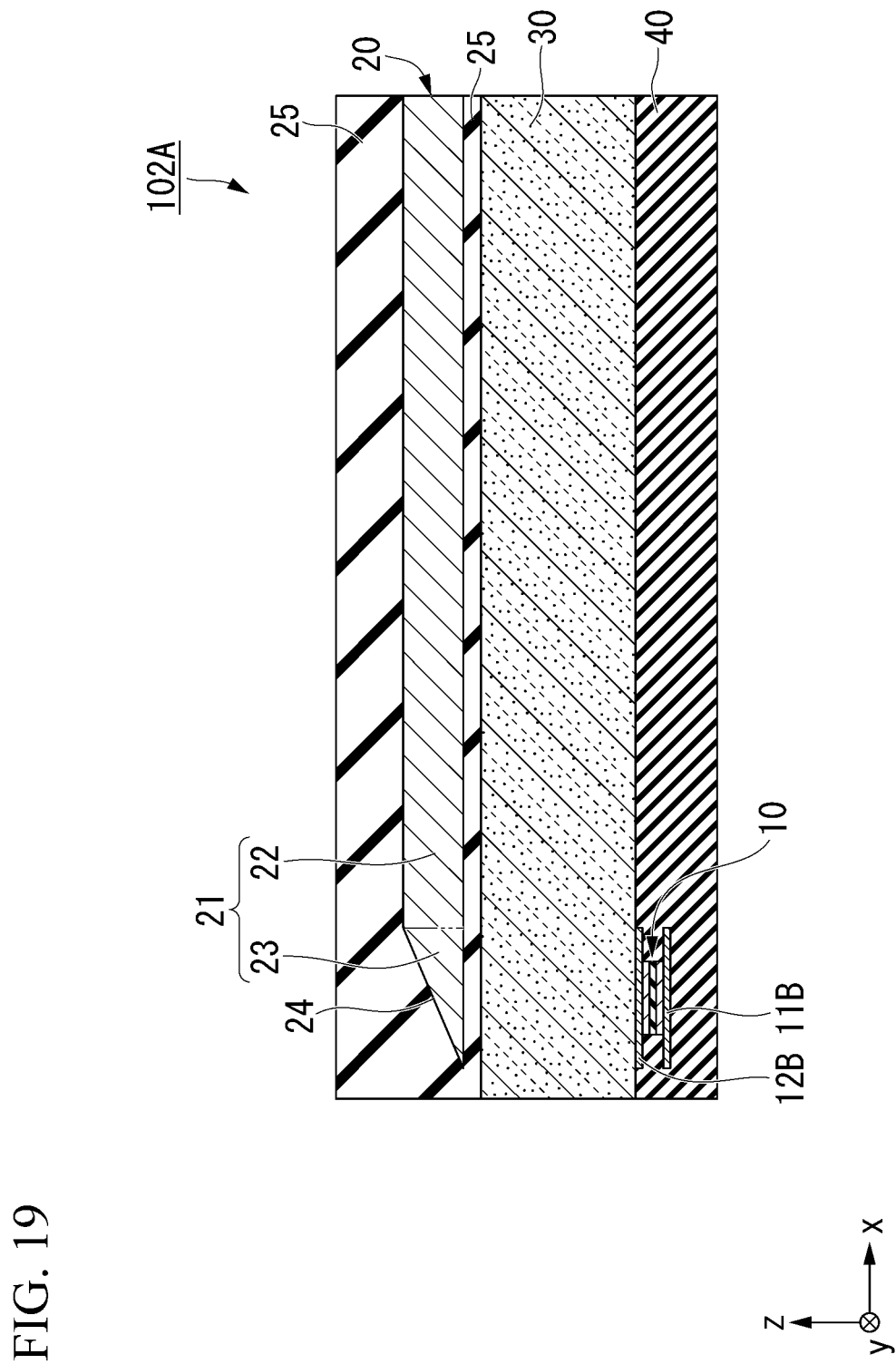
FIG. 19 is a cross-sectional view of a modified example of the light detection element according to the third embodiment.

FIG. 19 is a cross-sectional view of a modified example of the light detection element 102 according to the third embodiment. A light detection element 102A according to the modified example is different from the light detection element 102 in that there is a part of the cladding 25 between the core 21 and the substrate 30. The substrate 30 may not constitute a part of the cladding 25 and the core 21 may not be in direct contact with the substrate 30 as in the light detection element 102A shown in the modified example.

Fourth Embodiment

Figure 20:
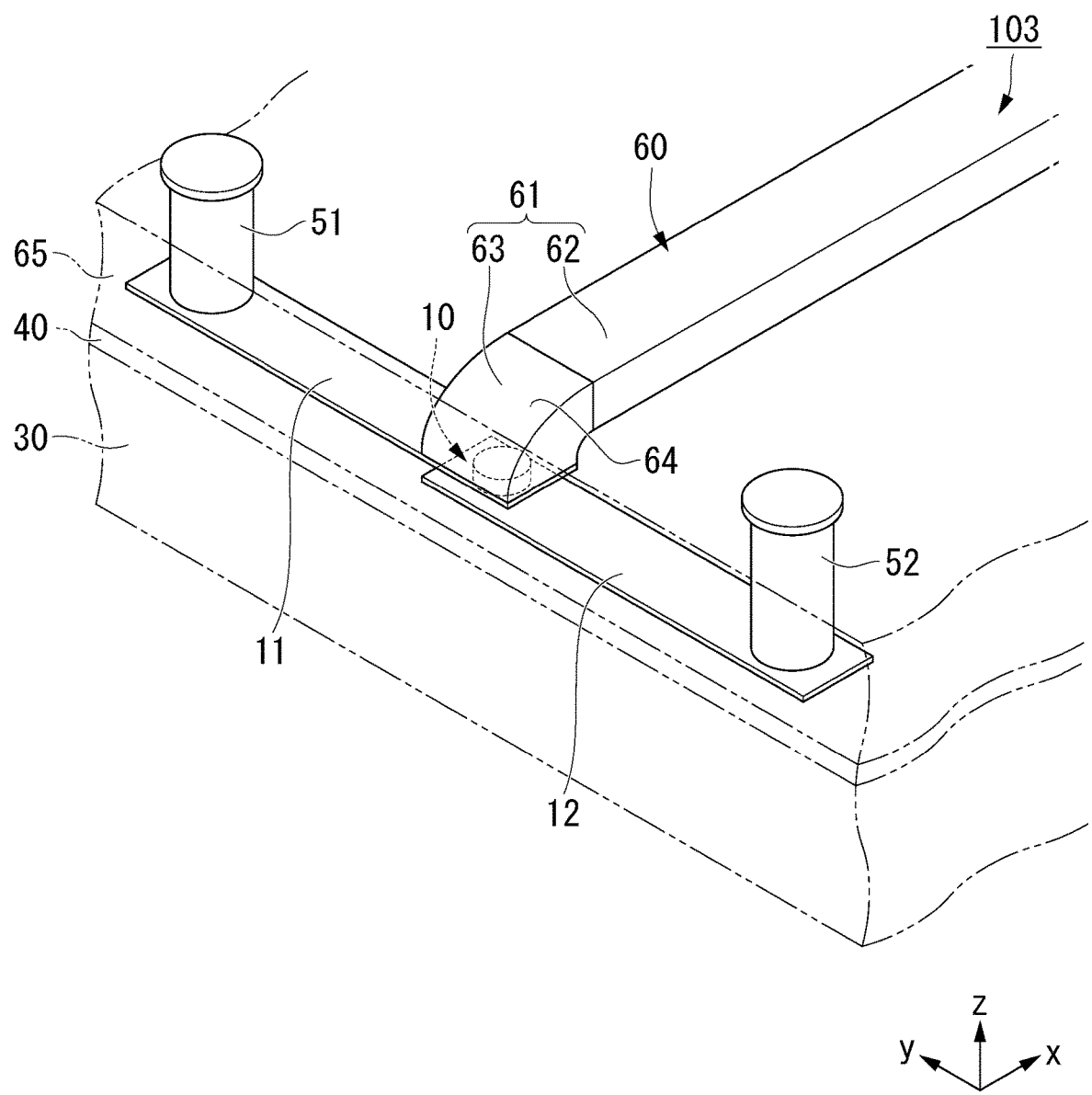
FIG. 20 is a perspective view of a light detection element according to a fourth embodiment.
Figure 21:
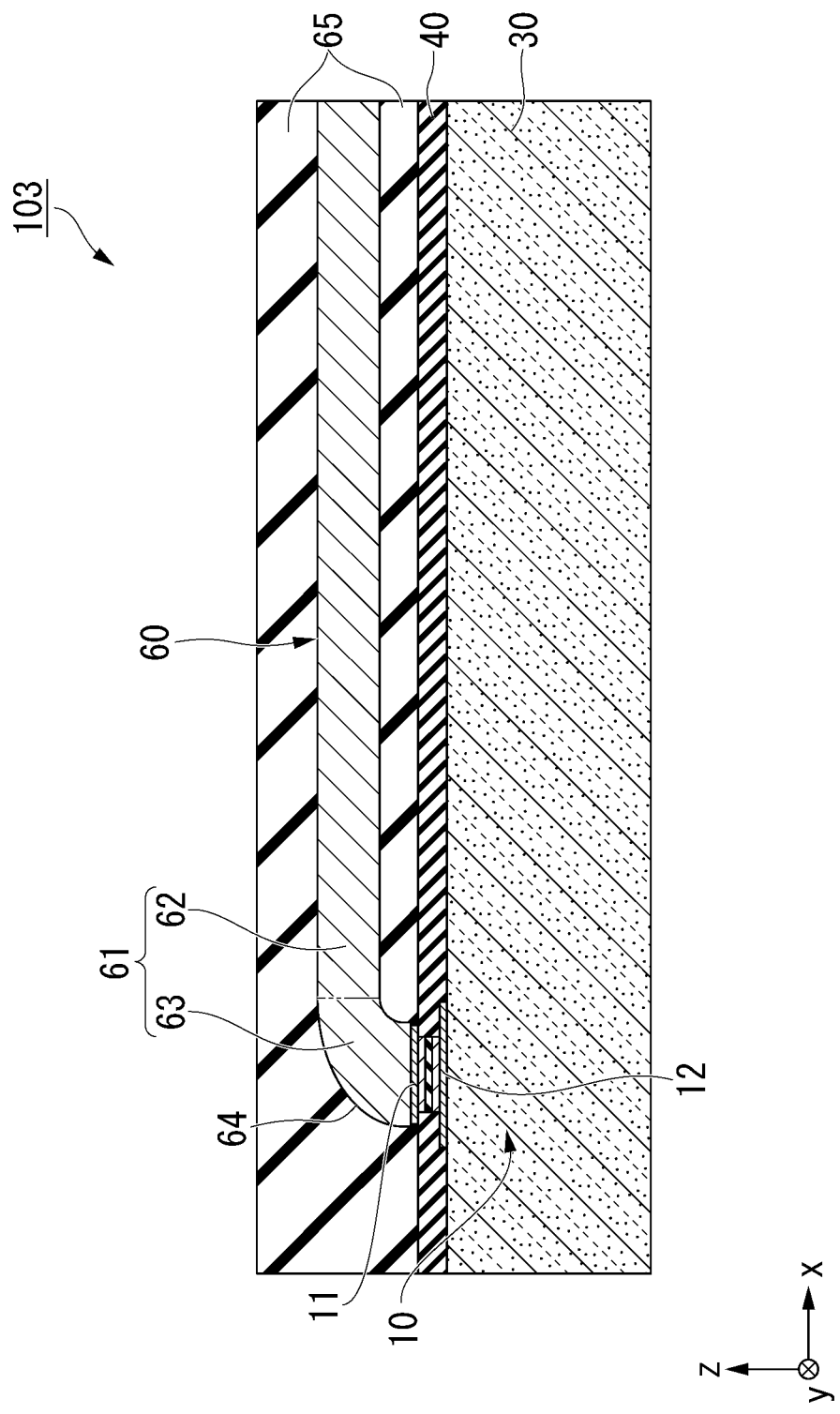
FIG. 21 is a cross-sectional view of the light detection element according to the fourth embodiment.

FIG. 20 is a perspective view of a light detection element 103 according to a fourth embodiment. FIG. 21 is a cross-sectional view of the light detection element 103 according to the fourth embodiment. FIG. 21 is an xz cross-section passing through the center of a core 61 in a width direction.

The light detection element 103 has, for example, a magnetic element 10, an optical waveguide 60, a substrate 30, and an insulating layer 40. Light that has propagated through the optical waveguide 60 is applied to the magnetic element 10. In the light detection element 103 according to the fourth embodiment, components similar to those of the light detection element 100 according to the first embodiment are denoted by similar reference signs and description thereof is omitted.

Light emitted from a light source propagates through the optical waveguide 60. The light propagating through the optical waveguide 60 is similar to the light propagating through the optical waveguide 20 according to the first embodiment.

The optical waveguide 60 includes at least a core 61 and a cladding 65. At least a part of the core 61 is covered with the cladding 65. A material constituting the core 61 is similar to that of the core 21 according to the first embodiment. A material constituting the cladding 65 is similar to the cladding 25 according to the first embodiment.

The core 61 includes, for example, a main part 62 and a second part 63. The main part 62 extends, for example, in the x-direction. The width of the core 61 in the y-direction is similar to that of the core 21. A thickness of the main part 62 of the core 61 in the z-direction is similar to that of the main part 22 of the core 21.

The second part 63 is connected to the main part 62. The second part 63 is connected to an end of the main part 62 opposite to a light incidence end. Light propagates from the main part 62 toward the second part 63. The second part 63 is curved in a direction toward the magnetic element 10 with respect to a first direction. The second part 63 is curved, for example, from the main part 62 extending in the x-direction toward the magnetic element 10.

The light propagating through the second part 63 is applied to the magnetic element 10. The position of the second part 63 in the z-direction (the lamination direction of the magnetic element 10) is different from the position of the magnetic element 10 in the z-direction. At least a part of the second part 63 is located at, for example, a position overlapping the magnetic element 10 when viewed from the lamination direction of the magnetic element 10. For example, the second part 63 is located above the magnetic element 10 in the z-direction. The light that has propagated through the optical waveguide 60 is applied to the magnetic element 10. When the first electrode 11 is in contact with the core 61, an absolute value of a refractive index difference between the first electrode 11 and the core 61 may be smaller than an absolute value of a refractive index difference between the core 61 and the cladding 65. If a condition of this refractive index difference is satisfied, reflection of light that has propagated through the core 61 at an interface between the core 61 and the first electrode 11 can be suppressed and most of the light that has propagated through the core 61 can be applied to the magnetic element 10. In this case, the refractive index of the first electrode 11 may be smaller or larger than the refractive index of the core 61 and the refractive index of the first electrode 11 may be the same as that of the core 21.

The magnetic element 10 and the optical waveguide 60 are located, for example, on the substrate 30. The position of the magnetic element 10 in the z-direction is between the position of the second part 63 in the z-direction and the position of the substrate 30 in the z-direction. For example, the magnetic element 10 is sandwiched between the substrate 30 and the second part 63 in the z-direction.

The light detection element 103 can be manufactured in a procedure similar to that of the light detection element 100. The light detection element 103 operates when light propagating through the optical waveguide 60 is applied to the magnetic element 10. The light propagating through the optical waveguide 60 is light having a change in an intensity and includes, for example, an optical signal having a change in an intensity of light. Light propagating through the core 61 propagates through the second part 63 and is applied to the magnetic element 10. The magnetic element 10 converts light into an electrical signal. An operation in which the magnetic element 10 converts light into an electric signal is similar to an operation of the light detection element 100 according to the first embodiment.

The light detection element 103 according to the fourth embodiment can replace light with an electric signal by replacing light propagating through the optical waveguide 60 and applied to the magnetic element 10 with an output voltage from the magnetic element 10. The light detection element 103 according to the fourth embodiment has effects similar to those of the light detection element 100 according to the first embodiment.

Also, in the fourth embodiment, positional relationships between the magnetic element 10, the optical waveguide 60, and the substrate 30 are not limited to the configuration shown in FIG. 20.

For example, the second part 63 of the optical waveguide 60 may be located between the substrate 30 and the magnetic element 10 as in the light detection element 101 according to the second embodiment. In this case, both the magnetic element 10 and the optical waveguide 60 are located on the substrate 30. The position of the second part 63 in the z-direction may be located between the position of the magnetic element 10 in the z-direction and the position of the substrate 30 in the z-direction. For example, at least a part of the second part 63 is sandwiched between the magnetic element 10 and the substrate 30 in the z-direction. The magnetic element 10 is located at a position where light that has propagated through the optical waveguide 60 is applied. For example, a position of the magnetic element 10 in the z-direction may be above the second part 63.

Also, for example, the optical waveguide 60 and the magnetic element 10 may be formed on different surfaces of the substrate 30 as in the light detection element 102 according to the third embodiment. For example, the optical waveguide 60 may be located on the first surface 31 side of the substrate 30 and the magnetic element 10 may be located on the second surface 32 side of the substrate 30.

The position of the substrate 30 in the z-direction may be between the position of the second part 63 in the z-direction and the position of the magnetic element 10 in the z-direction. For example, a part of the substrate 30 may be sandwiched between the second part 63 and the magnetic element 10 in the z-direction. The magnetic element 10 is located at a position where light that has propagated through the optical waveguide 60 is applied. For example, a position of the magnetic element 10 in the z-direction may be located below the second part 63. In this case, the light that has propagated through the second part 63 of the optical waveguide 60 is transmitted through the substrate 30 and applied to the magnetic element 10.

Fifth Embodiment

Figure 22:
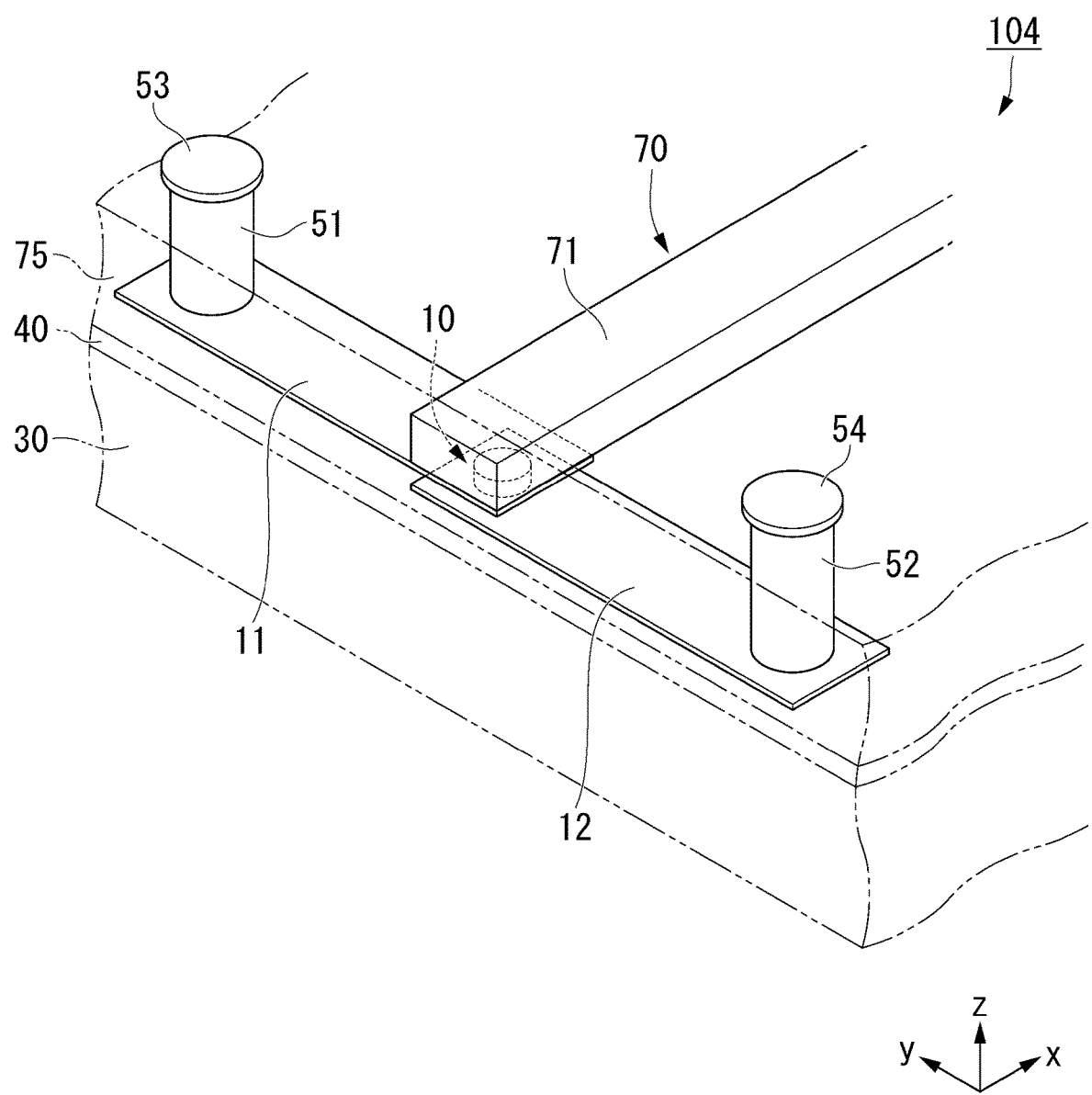
FIG. 22 is a perspective view of a light detection element according to a fifth embodiment.
Figure 23:
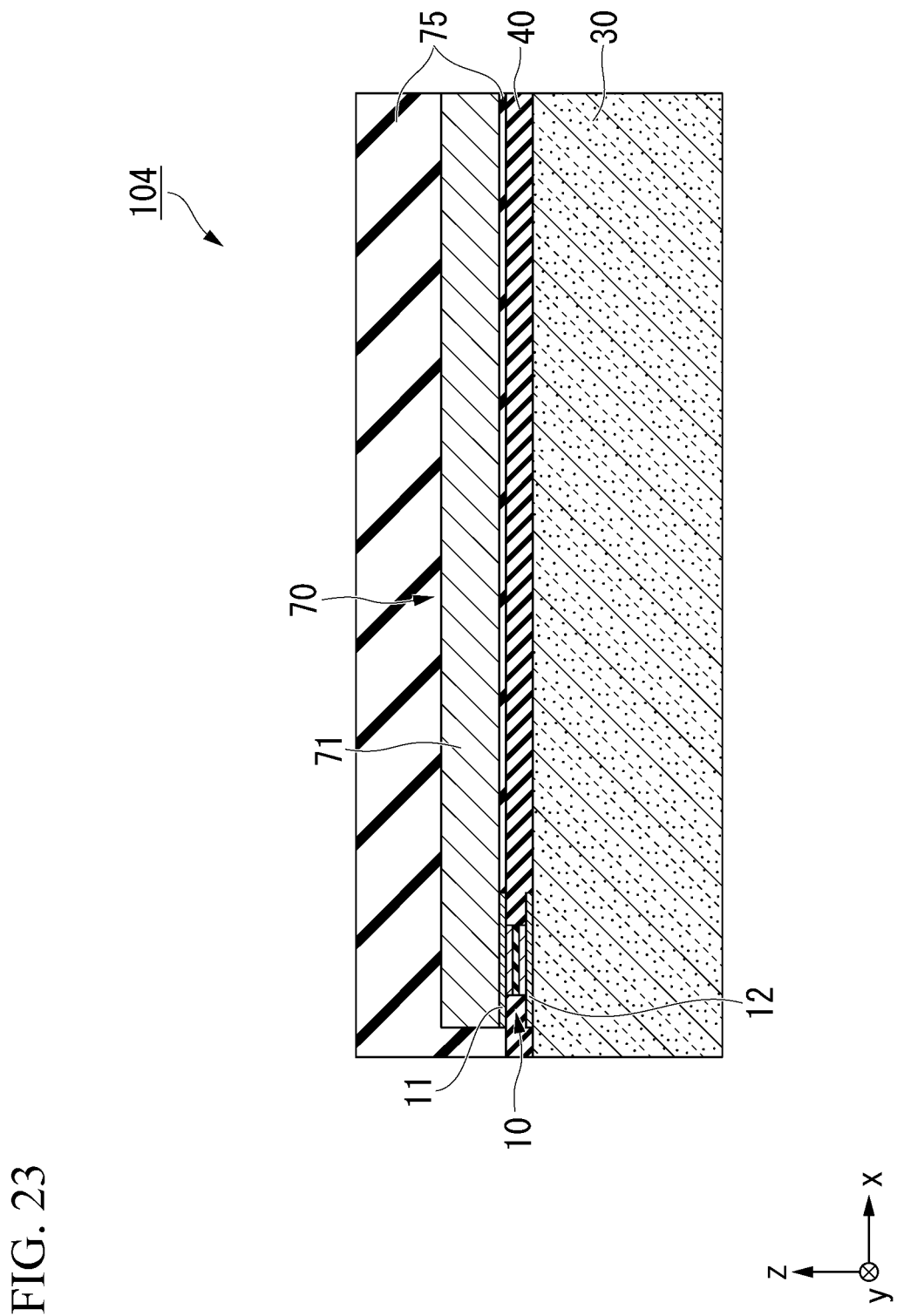
FIG. 23 is a cross-sectional view of the light detection element according to the fifth embodiment.

FIG. 22 is a perspective view of a light detection element 104 according to a fifth embodiment. FIG. 23 is a cross-sectional view of the light detection element 104 according to the fifth embodiment. FIG. 23 is an xz cross-section passing through the center of a core 71 in a width direction.

The light detection element 104 has, for example, a magnetic element 10, an optical waveguide 70, a substrate 30, and an insulating layer 40. Light that has propagated through the optical waveguide 70 is applied to the magnetic element 10. In the light detection element 104 according to the fifth embodiment, components similar to those of the light detection element 100 according to the first embodiment are denoted by similar reference signs and description thereof is omitted.

Light emitted from a light source propagates through the optical waveguide 70. The light propagating through the optical waveguide 70 is similar to the light propagating through the optical waveguide 20 according to the first embodiment.

The optical waveguide 70 includes at least a core 71 and a cladding 75. At least a part of the core 71 is covered with the cladding 75. A material constituting the core 71 is similar to that of the core 21 according to the first embodiment. A material constituting the cladding 75 is similar to that of the cladding 25 according to the first embodiment. A width of the core 71 in the y-direction and a thickness of the core 71 in the z-direction are similar to those of the core 21.

Light propagating through the optical waveguide 70 is applied to the magnetic element 10. A part of the core 71 is located, for example, at a position overlapping the magnetic element 10 when viewed from the lamination direction of the magnetic element 10. A first electrode 11 is in contact with the core 71 and an absolute value of a refractive index difference between the first electrode 11 and the core 71 is smaller than an absolute value of a refractive index difference between the core 71 and the cladding 75. As a result, reflection of the light that has propagated through the core 71 at an interface between the core 71 and the first electrode 11 can be suppressed and the light that has propagated through the core 71 is applied from an interface between the first electrode 11 and the core 71 to the magnetic element 10. The refractive index of the first electrode 11 may be smaller or larger than the refractive index of the core 71 and the refractive index of the first electrode 11 may be the same as that of the core 71.

The magnetic element 10 and the optical waveguide 70 are located, for example, on the substrate 30. The position of the magnetic element 10 in the z-direction is between the position of at least a part of the optical waveguide 70 in the z-direction and the position of the substrate 30 in the z-direction. For example, the magnetic element 10 is sandwiched between the substrate 30 and the optical waveguide 70 in the z-direction.

The light detection element 104 can be manufactured in a procedure similar to that of the light detection element 100. The light detection element 104 operates when light propagating through the optical waveguide 70 is applied to the magnetic element 10. The light propagating through the optical waveguide 70 is light having a change in an intensity and includes, for example, an optical signal having a change in an intensity of the light. The magnetic element 10 converts light into an electrical signal. The operation of the magnetic element 10 for converting light into an electric signal is similar to that of the light detection element 100 according to the first embodiment.

The light detection element 104 according to the fifth embodiment can replace light with an electric signal by replacing the light propagating through the optical waveguide 70 and applied to the magnetic element 10 with the output voltage from the magnetic element 10. The light detection element 104 according to the fifth embodiment has effects similar to those of the light detection element 100 according to the first embodiment.

Also, positional relationships between the magnetic element 10, the optical waveguide 70, and the substrate 30 in the fifth embodiment are not limited to the configuration shown in FIG. 22.

For example, the optical waveguide 70 may be located between the substrate 30 and the magnetic element 10 as in the light detection element 101 according to the second embodiment. The position of at least a part of the optical waveguide 70 in the z-direction may be between the position of the magnetic element 10 in the z-direction and the position of the substrate 30 in the z-direction. In this case, for example, a part of the optical waveguide 70 is sandwiched between the magnetic element 10 and the substrate 30 in the z-direction.

Also, for example, the optical waveguide 70 and the magnetic element 10 may be formed on different surfaces of the substrate 30 as in the light detection element 102 according to the third embodiment. For example, the optical waveguide 70 may be located on the first surface 31 side of the substrate 30 and the magnetic element 10 may be located on the second surface 32 side of the substrate 30. The core 71 of the optical waveguide 70 may or may not be in contact with the substrate 30.

The position of the substrate 30 in the z-direction may be located between the position of at least a part of the optical waveguide 70 in the z-direction and the height position of the magnetic element 10 in the z-direction. For example, a part of the substrate 30 may be sandwiched between the optical waveguide 70 and the magnetic element 10 in the z-direction.

While embodiments of the invention have been described and illustrated above, it should be understood that these are exemplary of the invention and are not to be considered as limiting. Additions, omissions, substitutions, and other modifications can be made without departing from the spirit or scope of the disclosure. Accordingly, the invention is not to be considered as being limited by the foregoing description, and is only limited by the scope of the appended claims.

Figure 24:
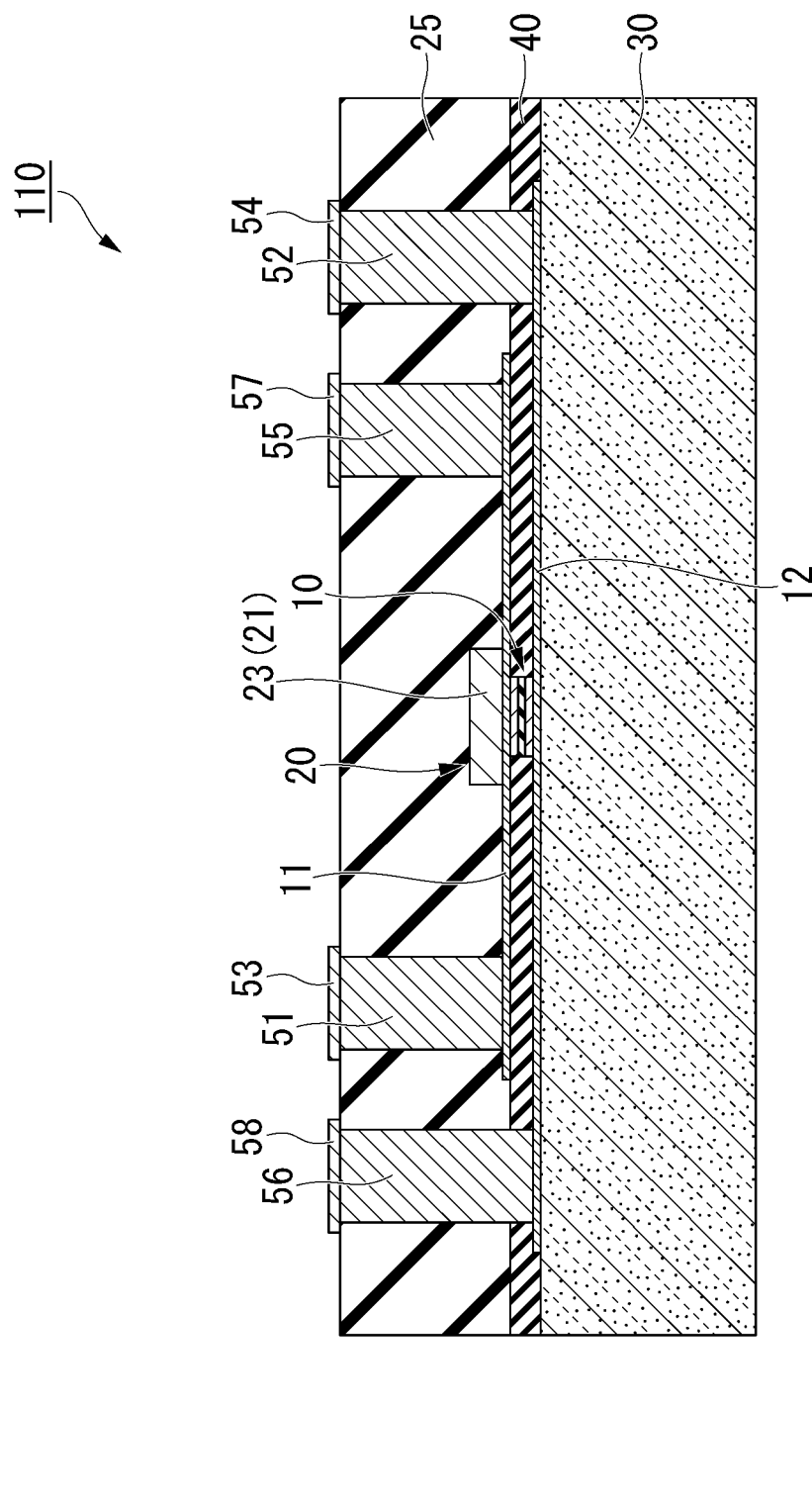
FIG. 24 is a cross-sectional view of a light detection element according to a first modified example.

For example, FIG. 24 is a cross-sectional view of a light detection element 110 according to the first modified example. FIG. 24 is a yz cross-section passing through the center of the magnetic element 10. The light detection element 110 is different from the light detection element 100 in that the light detection element 110 has via wirings 55 and 56 and external electrodes 57 and 58 and the external electrodes 54 and 58 are connected to a reference potential (for example, the ground). The reference potential may be the ground potential or a potential other than the ground potential.

The via wiring 55 connects the first electrode 11 and the external electrode 57. The via wiring 56 connects the second electrode 12 and the external electrode 58.

A configuration in which the via wiring 55 and the external electrode 57 are connected to the first electrode 11, the via wiring 56 and the external electrode 58 are connected to the second electrode 12, and the external electrodes 54 and 58 are connected to the reference potential may be applied to each of the second to fifth embodiments.

Figure 25:
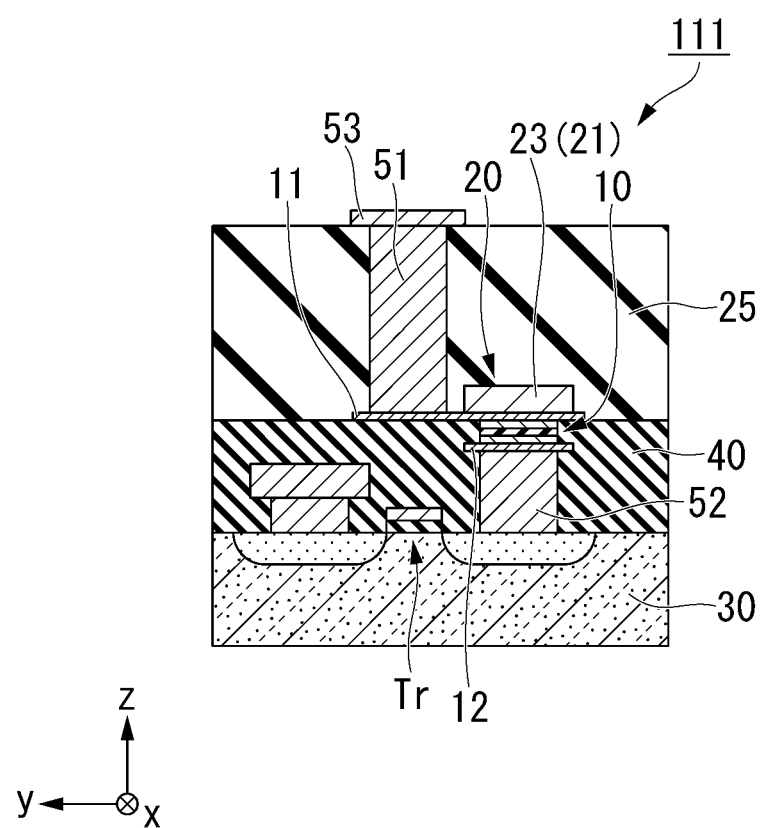
FIG. 25 is a cross-sectional view of a light detection element according to a second modified example.

Also, for example, FIG. 25 is a cross-sectional view of a light detection element 111 according to a second modified example. FIG. 25 is a yz cross-section passing through the center of the magnetic element 10. As shown in FIG. 25, an integrated circuit including a transistor Tr and the like may be formed on the substrate 30. For example, the via wiring 52 may be connected to the transistor Tr. The integrated circuit is, for example, electrically connected to the magnetic element 10, outputs a first signal (for example, "1"), for example, when the output voltage from the magnetic element 10 is greater than or equal to the threshold value, and outputs a second signal (for example, "0"), for example, when the output voltage is less than the threshold value.

A configuration in which the integrated circuit is formed on the substrate 30 may be applied to each of the second to fifth embodiments.

The light detection elements according to the above embodiments and modified examples can be applied to light sensor devices such as image sensors, transmitting/receiving devices for communication systems, and the like. The light detection element according to the above-described embodiment can detect a change in a state of light on the basis of a new principle.

While embodiments of the invention have been described and illustrated above, it should be understood that these are exemplary of the invention and are not to be considered as limiting. Additions, omissions, substitutions, and other modifications can be made without departing from the spirit or scope of the disclosure. Accordingly, the invention is not to be considered as being limited by the foregoing description, and is only limited by the scope of the appended claims.

EXPLANATION OF REFERENCES

1 First ferromagnetic layer
2 Second ferromagnetic layer
3 Spacer layer
4 Third ferromagnetic layer
5 Magnetic coupling layer
6 Underlayer
7 Perpendicular magnetization inducing layer
8 Cap layer
10 Magnetic element
11 First electrode
12 Second electrode
20, 20A Optical waveguide
21, 21A, 61, 71 Core
22, 62 Main part
23, 23A First part
24, 24A Tilted reflective surface
25, 25A, 65, 75 Cladding
30 Substrate
31 First surface
32 Second surface
40 Insulating layer
51, 52, 55, 56 Via wiring
53, 54 External electrode
57, 58 Ground electrode
60, 70 Optical waveguide
63 Second part
100, 101, 102, 102A, 103, 104, 110, 111 Light detection element

What is claimed is:

1. A light detection element comprising:
a magnetic element; and
an optical waveguide,
wherein the magnetic element includes a first ferromagnetic layer, a second ferromagnetic layer, and a spacer layer sandwiched between the first ferromagnetic layer and the second ferromagnetic layer,
the optical waveguide includes at least a core and a cladding covering at least a part of the core,
light that has propagated through the optical waveguide is applied to the magnetic element, and
the magnetic element has a magnetic tunnel junction containing the first ferromagnetic layer, the spacer layer, and the second ferromagnetic layer.

2. A light detection element comprising:
a magnetic element; and
an optical waveguide,
wherein the magnetic element includes a first ferromagnetic layer, a second ferromagnetic layer, and a spacer layer sandwiched between the first ferromagnetic layer and the second ferromagnetic layer,
the optical waveguide includes at least a core and a cladding covering at least a part of the core,
light that has propagated through the optical waveguide is applied to the magnetic element, and
the magnetic element is a magnetoresistance effect element.

3. A light detection element comprising:
a magnetic element; and
an optical waveguide,
wherein the magnetic element includes a first ferromagnetic layer, a second ferromagnetic layer, and a spacer layer sandwiched between the first ferromagnetic layer and the second ferromagnetic layer, the optical waveguide includes at least a core and a cladding covering at least a part of the core, light that has propagated through the optical waveguide is applied to the magnetic element, the core includes a main part extending in a first direction intersecting a lamination direction of the magnetic element and a first part connected to the main part, the optical waveguide includes a tilted reflective surface that is a part of an interface between the first part, which is a part of the core, and the cladding, and that intersects the lamination direction and the first direction, and the light reflected by the tilted reflective surface is applied to the magnetic element.

4. A light detection element comprising:

a magnetic element; and an optical waveguide, wherein the magnetic element includes a first ferromagnetic layer, a second ferromagnetic layer, and a spacer layer sandwiched between the first ferromagnetic layer and the second ferromagnetic layer, the optical waveguide includes at least a core and a cladding covering at least a part of the core, light that has propagated through the optical waveguide is applied to the magnetic element, the core includes a main part extending in a first direction intersecting a lamination direction of the magnetic element and a second part connected to the main part, the second part is curved toward the magnetic element with respect to the first direction, and the light that has propagated through the second part is applied to the magnetic element.

5. A light detection element comprising:

a magnetic element;

an optical waveguide; and an electrode, wherein the magnetic element includes a first ferromagnetic layer, a second ferromagnetic layer, and a spacer layer sandwiched between the first ferromagnetic layer and the second ferromagnetic layer, the optical waveguide includes at least a core and a cladding covering at least a part of the core, light that has propagated through the optical waveguide is applied to the magnetic element, the electrode is electrically connected to the magnetic element and is in contact with the core, and an absolute value of a refractive index difference between the core and the electrode is smaller than an absolute value of a refractive index difference between the core and the cladding.

6. The light detection element according to claim 3, wherein a position of the tilted reflective surface in the lamination direction is different from a position of the magnetic element in the lamination direction.

7. The light detection element according to claim 3, further comprising a substrate, wherein the magnetic element and the optical waveguide are located on the substrate, and a position of the magnetic element in a direction perpendicular to a surface of the substrate is between a position of the tilted reflective surface in the direction perpendicular to the surface of the substrate and a position of the substrate in the direction perpendicular to the surface of the substrate.

8. The light detection element according to claim 3 further comprising a substrate, wherein the magnetic element and the optical waveguide are located on the substrate, and a position of the tilted reflective surface in a direction perpendicular to a surface of the substrate is between a position of the magnetic element in the direction perpendicular to the surface of the substrate and a position of the substrate in the direction perpendicular to the surface of the substrate.

9. The light detection element according to claim 3, further comprising a substrate, wherein the substrate has a first surface and a second surface opposite each other in a thickness direction, the optical waveguide is located on a first surface side of the substrate, and the magnetic element is located on a second surface side of the substrate.

10. The light detection element according to claim 8, wherein the substrate is in contact with the core.

11. The light detection element according to claim 9, wherein the substrate is in contact with the core.

12. The light detection element according to claim 4, wherein a position of the second part in the lamination direction is different from a position of the magnetic element in the lamination direction.

13. The light detection element according to claim 6, further comprising a substrate, wherein the magnetic element and the optical waveguide are located on the substrate, and a position of the magnetic element in a direction perpendicular to a surface of the substrate is between a position of the tilted reflective surface in the direction perpendicular to the surface of the substrate and a position of the substrate in the direction perpendicular to the surface of the substrate.

14. The light detection element according to claim 6, further comprising a substrate, wherein the magnetic element and the optical waveguide are located on the substrate, and a position of the tilted reflective surface in a direction perpendicular to a surface of the substrate is between a position of the magnetic element in the direction perpendicular to the surface of the substrate and a position of the substrate in the direction perpendicular to the surface of the substrate.

15. The light detection element according to claim 6, further comprising a substrate, wherein the substrate has a first surface and a second surface opposite each other in a thickness direction, the optical waveguide is located on a first surface side of the substrate, and the magnetic element is located on a second surface side of the substrate.

16. The light detection element according to claim 14, wherein the substrate is in contact with the core.

17. The light detection element according to claim 15, wherein the substrate is in contact with the core.

* * * * *